US009698382B2

(12) United States Patent
Kurata et al.

(10) Patent No.: US 9,698,382 B2
(45) Date of Patent: Jul. 4, 2017

(54) ORGANIC LIGHT EMITTING ELEMENT WITH INCREASED EFFICIENCY OF EXTRACTING BLUE LIGHT

(71) Applicant: JOLED INC., Tokyo (JP)

(72) Inventors: Keiko Kurata, Hyogo (JP); Muneharu Sato, Tokyo (JP); Tetsuro Kondoh, Tokyo (JP); Shinichiro Ishino, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/908,337

(22) PCT Filed: Jul. 23, 2014

(86) PCT No.: PCT/JP2014/003865

§ 371 (c)(1),
(2) Date: Jan. 28, 2016

(87) PCT Pub. No.: WO2015/015762

PCT Pub. Date: Feb. 5, 2015

(65) Prior Publication Data

US 2016/0164040 A1 Jun. 9, 2016

(30) Foreign Application Priority Data

Aug. 1, 2013 (JP) ................................. 2013-160596

(51) Int. Cl.
*H01L 27/15* (2006.01)
*H01L 31/12* (2006.01)
(Continued)

(52) U.S. Cl.
CPC ...... *H01L 51/5271* (2013.01); *H01L 51/5234* (2013.01); *H01L 51/5265* (2013.01); *H01L 51/5275* (2013.01); *H01L 27/3211* (2013.01)

(58) Field of Classification Search
CPC . H01L 27/32; H01L 27/3202; H01L 27/3204; H01L 27/3209; H01L 27/3225;
(Continued)

(56) References Cited

U.S. PATENT DOCUMENTS 7,342,356 B2 3/2008 McCormick et al.
8,237,359 B2 8/2012 Higashida et al.
(Continued)

FOREIGN PATENT DOCUMENTS

CN 1841813 10/2006
JP 2003-007450 1/2003
(Continued)

OTHER PUBLICATIONS

International Search Report (Corrected Version in Japanese) issued in PCT/JP2014/003865, dated Nov. 4, 2014 and English language translation (Non-corrected version).
(Continued)

*Primary Examiner* — Hoai V Pham
(74) *Attorney, Agent, or Firm* — Greenblum & Bernstein, P.L.C.

(57) ABSTRACT

Each of blue light emitting elements includes: a photoanode; a translucent cathode; an organic light emitting layer between the photoanode and the translucent cathode; a first functional layer between the organic light emitting layer and the photoanode; and a second functional layer between the organic light emitting layer and the translucent cathode, and has a resonator structure. The first functional layer has an optical film thickness of 48-62 nm. The translucent cathode is a stack of a first translucent conductive layer, a metal layer, and a second translucent conductive layer stacked in this order from the second functional layer side. The first translucent conductive layer has a refractivity of 2.0-2.4, and a film thickness of 85-97 nm. The metal layer has a refrac-
(Continued)

38
37
36
35
33
33
34
321
322
323
32
31
C5
C6 tivity different by 0 to 2.0 from that of the first translucent conductive layer, and has a film thickness of 2-22 nm.

10 Claims, 18 Drawing Sheets

(51) Int. Cl.
*H01L 33/00* (2010.01)
*H01L 51/52* (2006.01)
*H01L 27/32* (2006.01)

(58) Field of Classification Search
CPC ............. H01L 27/3251; H01L 27/3258; H01L 2227/32; H01L 2924/12044
See application file for complete search history.

(56) References Cited

U.S. PATENT DOCUMENTS 8,664,655 B2 3/2014 Lee et al.
8,680,542 B2 3/2014 Kurata et al.
2006/0061272 A1 3/2006 McCormick et al.
2008/0107798 A1 5/2008 McCormick et al.
2009/0322718 A1 12/2009 Higashida et al.
2011/0198629 A1 8/2011 Lee et al.
2012/0104423 A1 5/2012 Kurata et al.
2014/0203271 A1 7/2014 Yoneda et al.
2015/0295017 A1* 10/2015 Kashiwabara ...... H01L 27/3211 257/40

FOREIGN PATENT DOCUMENTS

JP 2003-168571 6/2003
JP 2006-269387 10/2006
JP 2010-034030 2/2010
JP 2011-165664 8/2011
JP 2012-009148 1/2012
JP 2012-212691 11/2012
JP 2013-235690 11/2013
WO 2012/020452 2/2012
WO 2013/065213 5/2013

OTHER PUBLICATIONS

China Office Action, issued in China Patent Application No. 201480042637.5, mail date is Oct. 28, 2016.

* cited by examiner 15
16
17
18
19
20
21
22
Driver circuit
Driver circuit
Driver circuit
Driver circuit
Organic EL panel
Control circuit
X
Y FIG. 7
(a)
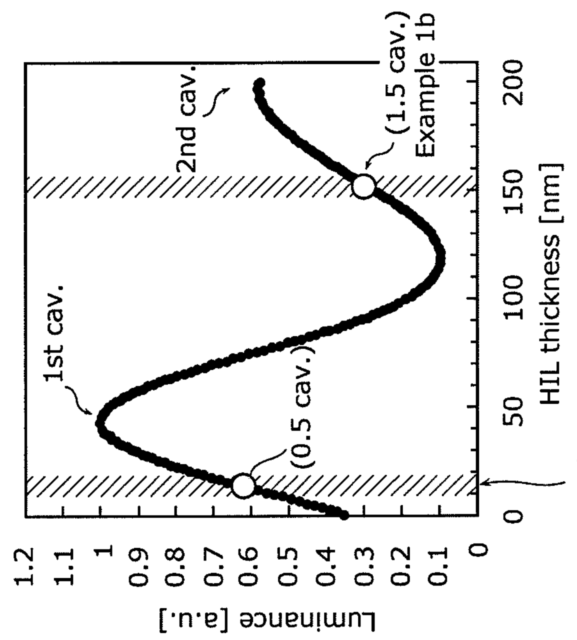
(b)
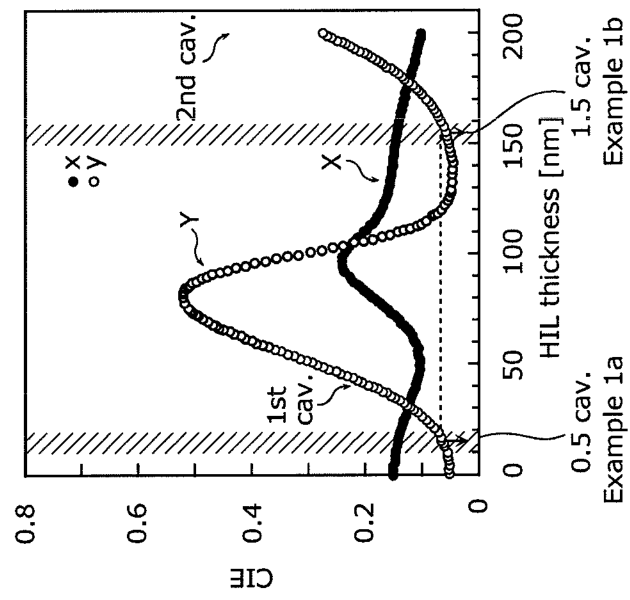

FIG. 8

Layer configuration, sheet resistance, and transmissivity of translucent electrode

| No. | Layer configuration Numeral in parentheses is film thickness [nm] | Sheet resistance [Ω/sq] | Transmissivity [%] @525 nm |
|---|---|---|---|
| 1 | ITO (50) | 80 | 85 |
| 2 | ITO (50)/Ag (8)/ITO (50) | 15 | 78 |
| 3 | ITO (50)/Ag (12)/ITO (50) | 5.2 | 72 |
| 4 | ITO (50)/Ag (16)/ITO (50) | 2.6 | 67 |
| 5 | ITO (50)/Ag (24)/ITO (50) | 1.3 | 58 |
| 6 | ITO (75)/Ag (24)/ITO (75) | 1.1 | 29 |
| 7 | ITO (25)/Ag (24)/ITO (25) | 1.2 | 38 |

FIG. 9

(Top emission structure)

| | Refractivity @550 nm | Example 1a | | Comparative example 1a' | |
|---|---|---|---|---|---|
| | | Film thickness | Optical path length | Film thickness | Optical path length |
| Glass substrate 11 | 1.5 | 0.5 mm | | 0.5 mm | |
| Sealing resin | 1.5 | 6000 nm | 7500 | 6000 nm | 7500 |
| Sealing layer (ALD) | 1.6 | 20 nm | 32 | 20 nm | 32 |
| Thin-film sealing layer | 1.9 | 660 nm | 1300 | 620 nm | 1200 |
| Second translucent conductive layer 83 | 2.1 | 0 - 100 nm | 0 - 210 | 0 nm | 0 |
| Metal layer 82 | 0.1 | 13 nm | 1.3 | 0 nm | 0 |
| First translucent conductive layer 81 | 2.1 | 90 nm | 180 | 35 nm | 74 |
| Electron transporting layer 7 | 1.8 | 35 nm | 63 | 35 nm | 63 |
| Light emitting layer (Blue) 6b | 1.8 | 50 nm | 90 | 50 nm | 90 |
| Hole transporting layer 5 | 1.7 | | | | |
| Hole injecting layer 4 | 1.6 | 30 nm | 48 - 62 | 30 nm | 48 - 62 |
| Translucent conductive layer 3 | 2.05 | | | | |
| Photoanode 2 | | 400 nm | | 400 nm | |
| Lum/y | | 84 | | 57 | |

(a)
Second translucent conductive layer 83
(ITO film thickness (nm))
0 - 50
50 - 80
80 - 100
50 - 80
0 - 50
First translucent conductive layer 81
(ITO film thickness (nm))
(b)
Metal layer 82 (Ag film thickness (nm))
50 - 80
80 - 100
50 - 80
Second translucent conductive layer 83
(ITO film thickness (nm))

(a)
-10 nm
(b)
-5 nm
(c)
Center (0 nm)
(d)
+5 nm
(e)
+10 nm
Metal layer 82 (Ag film thickness (nm))
First translucent conductive layer 81 (ITO film thickness (nm))
22
20
15
10
5
2
80
85
90
95
100
0 - 45
45 - 70
70 - 80
80 - 100

FIG. 13

(Top emission structure)

| | Refractivity @550 nm | Example 1b | | Comparative example 1b' | |
|---|---|---|---|---|---|
| | | Film thickness | Optical path length | Film thickness | Optical path length |
| Glass substrate 11 | 1.5 | 0.5 mm | | 0.5 mm | |
| Sealing resin | 1.5 | 6000 nm | 7500 | 6000 nm | 7500 |
| Sealing layer (ALD) | 1.6 | 20 nm | 32 | 20 nm | 32 |
| Thin-film sealing layer | 1.9 | 620 nm | 1200 | 620 nm | 1200 |
| Second translucent conductive layer 83 | 2.1 | 50 nm | 105 | 0 nm | 0 |
| Metal layer 82 | 0.1 | 13 nm | 1.3 | 0 nm | 0 |
| First translucent conductive layer 81 | 2.1 | 90 nm | 180 | 35 nm | 74 |
| Electron transporting layer 7 | 1.8 | 35 nm | 63 | 35 nm | 63 |
| Light emitting layer (Blue) 6b | 1.8 | 50 nm | 90 | 50 nm | 90 |
| Hole transporting layer 5 | 1.7 | 30 + 140 nm | 272 - 286 | 30 + 140 nm | 272 - 286 |
| Hole injecting layer 4 | 1.6 | | | | |
| Translucent conductive layer 3 | 2.0 | | | | |
| Photoanode 2 | | 400 nm | | 400 nm | |
| Lum/y | | 47 | | 41 | |

FIG. 15

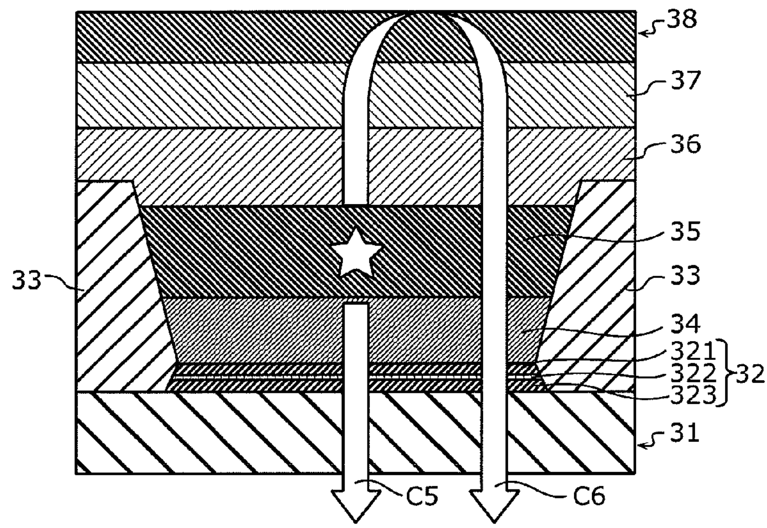

FIG. 16

Example 2 (Bottom emission structure)

| | Refractivity @550 nm | Example 2 | | Comparative example 2' | |
|---|---|---|---|---|---|
| | | Film thickness | Optical path length | Film thickness | Optical path length |
| Photoanode 38 | | 200 nm | | 200 nm | |
| Hole injecting layer 37 | 1.6 | 5 nm | 7.8 | 5 nm | 7.8 |
| Hole transporting layer 36 | 1.7 | 10 nm | 17 | 10 nm | 17 |
| Light emitting layer (Blue) 35 | 1.8 | 50 nm | 90 | 50 nm | 90 |
| Electron transporting layer 34 | 1.8 | 10 nm | 18 | 10 nm | 10 |
| First translucent conductive layer 321 | 2.1 | 10 nm | 21 | 50 nm | 105 |
| Metal layer 322 | 0.12 | 14 nm | 1.7 | 0 nm | 0 |
| Second translucent conductive layer 323 | 2.1 | 60 nm | 126 | 0 nm | 0 |
| Glass substrate 31 | 1.5 | 0.5 mm | | 0.5 nm | |
| Lum/y | | 105 | | 42 | |

FIG. 17
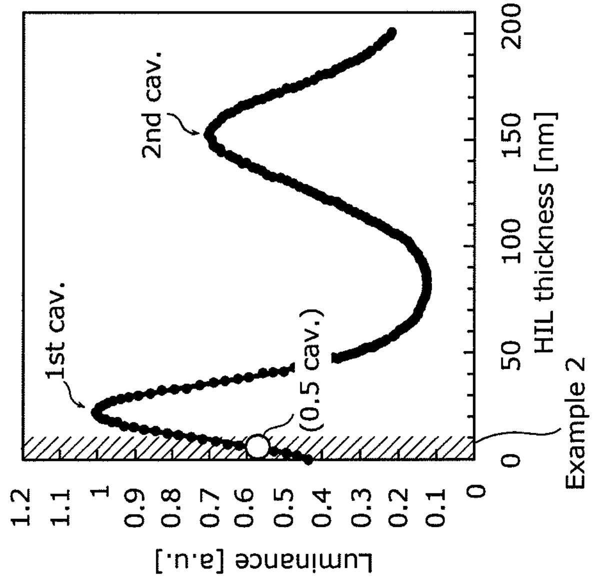
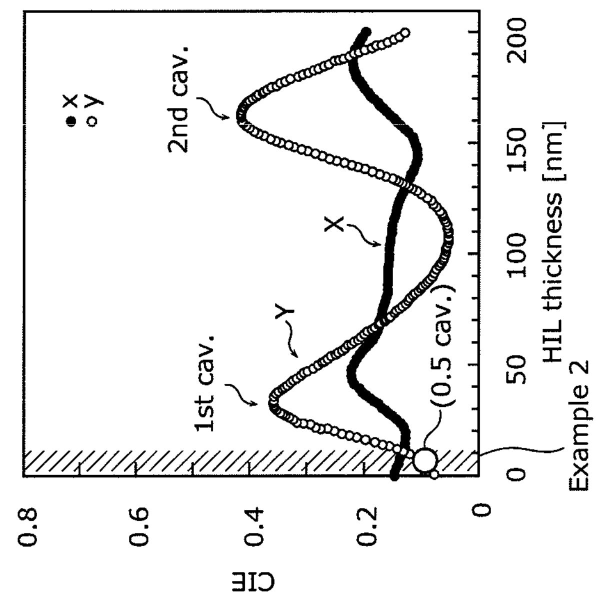

(a)
-5 nm
(b)
Center (0 nm)
(c)
+ 5 nm
Metal layer 322 (Ag film thickness (nm))
25
20
15
10
7
0 10 20 30 40 50 60 70 80
First translucent conductive layer 321 (ITO film thickness (nm))
Below 100
100 or more

ORGANIC LIGHT EMITTING ELEMENT WITH INCREASED EFFICIENCY OF EXTRACTING BLUE LIGHT

TECHNICAL FIELD

The present disclosure relates to organic light emitting elements which emit light utilizing an electric-field light emission phenomenon caused by an organic material, and particularly to organic light emitting elements which emit blue light.

BACKGROUND ART

In recent years, organic EL light emitting panels obtained by arranging organic light emitting elements in row and column directions above a substrate have become commercially practical as light emitting displays.

A generally known configuration for such an organic EL panel is a configuration in which a driver circuit (for example, including a thin film transistor (TFT)) is provided above a substrate, an insulating layer is formed above the driver circuit, and a plurality of organic light emitting elements are arranged on the insulating layer.

Each of the organic light emitting elements includes, as a basic structure, an anode provided on the insulating layer above the substrate, a stack of a light emitting layer and functional layers made of an organic light emitting material and formed on the anode, and a translucent conductive cathode provided on the stack.

As such a translucent conductive cathode, a translucent conductive material represented by indium tin oxide (ITO) has been generally used. In addition, as such functional layers, a hole injecting layer, a hole transporting layer, etc. are formed between the light emitting layer and the anode, and an electron injecting layer, an electron transporting layer, etc. are formed between the light emitting layer and the cathode.

Such an organic light emitting element is a current-driven light emitting element. This organic light emitting element receives an applied voltage between the anode and the cathode, and emits light through re-coupling of holes and electrons injected to the light emitting layer.

In an organic light emitting panel for full color display, such organic light emitting elements form R, G, and B sub-pixels, and a set of adjacent R, G, and B sub-pixels form a pixel.

In the field of organic light emitting panels, development of products suitable for achieving high definition has been desired, and such development has been advanced.

In the field of organic light emitting panels, increase in the efficiency of extracting light from each light emitting element has also been desired in view of reduction in power consumption and extension of the life of the element.

A technique that is also known is a technique disclosed in Patent Literature 1 in which a resonator structure is employed for each of organic light emitting elements each of which emits light having one of the colors in order to increase the light extraction efficiency. The use of the resonator structure is effective to increase the light extraction efficiency of the organic light emitting element.

CITATION LIST

Patent Literature

[PTL 1]
International Publication No. 2012/020452

[PTL 2]
Japanese Unexamined Patent Application Publication No. 2010-34030

[PTL 3]
Japanese Unexamined Patent Application Publication No. 2012-9148

SUMMARY OF INVENTION

Technical Problem

The present disclosure provides an organic light emitting element which emits blue light and is capable of reducing a sheet resistance value of a translucent cathode (translucent electrode), and extracting blue light having an excellent chromaticity with a high extraction efficiency.

Solution to Problem

An organic light emitting element according to an aspect of the present disclosure includes: a first electrode which reflects incident light; a second electrode which is disposed opposing the first electrode, and allows the incident light to pass through; an organic light emitting layer which is disposed between the first electrode and the second electrode, and emits at least blue light; a first functional layer which is disposed between the first electrode and the organic light emitting layer, and formed of one or more layers; and a second functional layer which is disposed between the organic light emitting layer and the second electrode, and formed of one or more layers.

The following paths are formed in the organic light emitting element: a first optical path in which part of the blue light emitted from the organic light emitting layer enters the first electrode through the first functional layer, is reflected by the first electrode, is emitted outside through the first functional layer, the organic light emitting layer, and the second functional layer, and the second electrode; and a second optical path in which remaining part of the blue light emitted from the organic light emitting layer travels to the second electrode through the second functional layer without travelling toward the first electrode, and is emitted outside through the second electrode.

The first functional layer has an optical film thickness ranging from 48 nm to 62 nm.

The second electrode is a stack of a first conductive layer made of a translucent conductive material, a metal layer, and a second conductive material made of a translucent conductive material stacked in this order from the side close to the organic light emitting layer. The first conductive layer has a refractivity ranging from 2.0 to 2.4, and has a film thickness ranging from 85 nm to 97 nm. The metal layer has a refractivity which is different by 0 to 2.0 from the refractivity of the first conductive layer, and has a film thickness ranging from 2 nm to 22 nm.

Advantageous Effects of Invention

In the organic light emitting element according to the aspect, blue light to be emitted from the organic light emitting layer passes through the first optical path and the second optical path, and then is emitted outside. Here, the first functional layer has an optical film thickness ranging from 48 nm to 62 nm, which allows light passing through the two optical paths to resonate. Thus, it is possible to extract blue light having an excellent chromaticity with a high extraction efficiency.

In addition, the second electrode at the light extraction side has a structure in which the first conductive layer made of a translucent conductive material, a metal layer, and a second conductive layer made of a translucent conductive material are stacked. Thus, it is possible to reduce a sheet resistance value more than a sheet resistance value which is obtained when a second electrode is made only of a translucent conductive material.

In addition, since a total of the film thicknesses of the first translucent conductive layer and the metal layer is set within the above range, it is possible to further increase the efficiency of extracting blue light.

BRIEF DESCRIPTION OF DRAWINGS

FIG. 7 is composed of: (a) which is a graph showing the efficiencies of extracting blue light from blue light emitting elements each including a hole injecting layer 4 having a different film thickness; and (b) which is a graph showing variation in the chromaticity of blue light extracted from the blue light emitting elements each including the hole injecting layer 4 having the different film thickness.

FIG. 8 is a diagram illustrating relationships between the film thicknesses of the respective layers in each of ITO/Ag/ITO electrodes and sheet resistances.

FIG. 9 is a diagram illustrating the refractivities, film thicknesses, and optical path lengths of the respective layers of each of blue light emitting elements according to Example 1a and the same in Comparative example 1a' which are used in simulations.

FIG. 10 is composed of (a) and (b) each of which is a mapping diagram of luminance/y values generated based on the results of the simulations regarding the blue light emitting elements according to Example 1a.

FIG. 11 is composed of (a) to (e) each of which is a mapping diagram of luminance/y values generated based on the results of the simulations regarding the blue light emitting elements according to Example 1a.

FIG. 13 is a diagram illustrating the refractivities, film thicknesses, and optical path lengths of the respective layers of each of blue light emitting elements according to Example 1b and the same according to Comparative example 1b' which are used in simulations.

FIG. 15 is a cross-sectional diagram which schematically illustrates a pixel structure of an organic display panel according to Embodiment 2.

FIG. 16 is a diagram illustrating the refractivities, film thicknesses, and optical paths of the respective layers of an organic light emitting element according to Embodiment 2.

FIG. 17 is composed of: (a) which is a graph showing the efficiencies of extracting blue light from blue light emitting elements according to Example 2 each including a hole injecting layer 37 having a different film thickness; and (b) which is a graph showing variation in the chromaticity of blue light extracted from the blue light emitting elements each including the hole injecting layer 37 having the different film thickness.

DESCRIPTION OF EMBODIMENTS

Underlying Knowledge Forming Basis of the Present Disclosure

In order to display an image having an excellent image quality on an organic light emitting panel, it is desired, particularly in an organic blue light emitting element, to obtain blue light having an excellent chromaticity with a high light extraction efficiency. Accordingly, also in an organic blue light emitting element having a resonator structure as described above, it is desirable to further increase the efficiency of extracting blue light having an excellent chromaticity.

In addition, when a translucent cathode is formed using a translucent conductive material such as ITO in an organic light emitting panel, a sheet resistance value is high, applied voltage decreases in the center part of the panel compared to the surrounding part, and luminance variation may be made. Accordingly, reduction in the sheet resistance value of the translucent cathode is also a problem to be solved.

As described above, in the blue light emitting element, it is possible to provide an excellent light extraction efficiency for blue light and an excellent chromaticity Y value (CIE chromaticity system) by using the resonator structure in the blue light emitting element. However, the Inventors keenly studied to reduce decrease in voltage in the center part of the panel and to increase the light extraction efficiency for blue light to be extracted from the light emitting element.

In order to reduce voltage decrease, it is conceivable to provide, in an organic EL panel, a bus bar which is (i) made of a metal having a low resistance against electricity and (ii) has a line width of 5 to 10 μm, as disclosed in Patent Literature 2, for example.

However, the bus bar provided in a high-definition organic EL panel reduces an aperture ratio of a pixel, and reduces the light extraction efficiency from the light emitting element. Particularly in a 15-inch panel having a high definition of 300 to 500 ppi or more, a pixel has a small width ranging from 30 to 80 μm. The Inventors found that it is extremely difficult to secure, in the pixel, space corresponding to the line width ranging from 5 to 10 μm while maintaining an aperture ratio ranging from 40% to 50% or more in order to extend the life of the element.

In view of this, the Inventors studied a method for configuring a translucent cathode having a reduced resistance considering balance between reduction in voltage decrease and increase in light extraction efficiency of an organic display element that provides a high definition of 500 ppi or more.

An ITO film having a film thickness of approximately 50 nm provides a resistance value (hereinafter, a sheet resistance value) of 80 to 100Ω/□ (□ denotes Sq.). In this case, depending on the positions of pixels arranged on the panel, a voltage decrease that is enough to cause luminance variation occurs.

Figure 20:
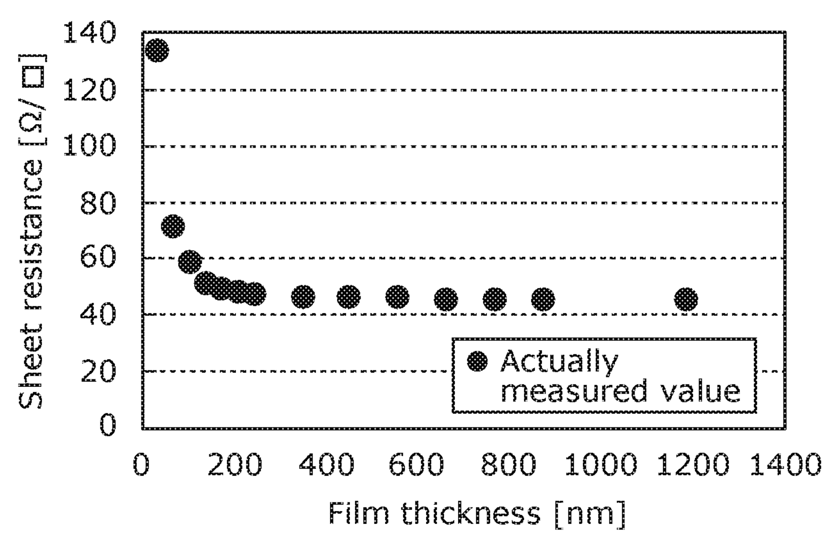
FIG. 20 is a diagram illustrating relationships between the film thicknesses of ITO films and sheet resistances.

Here, as illustrated in FIG. 20, in a general translucent conductive film such as ITO, the film thickness and the sheet resistance value are in an inverse proportion. Thus, it is possible to reduce a sheet resistance to some extent by setting a large film thickness. However, as is known from FIG. 20, it is difficult to reduce a sheet resistance value below 40Ω/□ by setting the film thickness of a translucent cathode made of ITO to 200 nm or above.

In addition, since a translucent conductive film is formed on an organic layer in a top emission structure, a thick translucent conductive film requires a long heating time, and such heating damages the element. On the other hand, a thick translucent cathode reduces a total transmissivity, which inevitably reduces the light extraction efficiency. Accordingly, in reality, the film thickness of a translucent cathode made of ITO has an upper limit.

In view of this, it is conceivable to achieve a translucent cathode having a reduced resistance by configuring the translucent cathode to be a stack of ITO layers and a metal layer arranged between the ITO layers. As for a configuration like this, for example, Patent Literature 3 discloses a translucent conductive film stack in which a first ITO layer (A1), a metal layer (M), a second ITO layer (A2) are stacked on a translucent plastic in this order.

In the translucent cathode having the three-layer structure like this, when the film thickness of the metal layer is increased, a sheet resistance value decreases in proportion to the film thickness of the metal layer. In order to achieve a display apparatus having a high definition, a sheet resistance needs to be reduced in order to reduce luminance variation depending on the positions of the pixels arranged on the panel of the display apparatus. For this reason, a metal layer having a sufficient film thickness is required. However, in the case of a thick metal layer, light transmissivity decreases, and light extraction efficiency inevitably decreases. In this way, the sheet resistance value and the light extraction efficiency has a trade-off relationship. Accordingly, there has conventionally been a problem that one of the following needs to be selected depending on product specifications etc: to reduce a sheet resistance value at the cost of a light extraction efficiency (the light extraction efficiency is small) and to increase the sheet resistance value (display variation occurs) prioritizing the light extraction efficiency.

In view of this, the inventors studied blue light emitting elements in order to further increase the efficiency of extracting blue light from each blue light emitting element while employing, for a translucent cathode in the blue light emitting element, a three-layer structure of a first translucent layer, a metal layer, and a second translucent layer, and securing a low sheet resistance value. More specifically, the Inventors calculated, in simulations, luminance values and chromaticity values of extracted blue light using translucent conductive electrodes each having a three-layer structure in which the three layers have film thicknesses which are different, as a whole, from those in any of the other translucent conductive electrodes.

FIG. 8 is a diagram illustrating relationships between layer configurations, sheet resistance values, and light transmissivities of translucent cathodes. In FIG. 8, sample No. 1 (Sample 1) shows a structure in which a translucent cathode is made only of a single ITO layer, and each of the other No. 2 to No. 7 shows a three-layer structure in which first and second translucent conductive layers (ITO) and a metal layer (Ag) have film thicknesses which are different, as a whole, from those in any of the other translucent conductive electrodes.

As illustrated in FIG. 8, a thick metal layer (Ag layer) in the translucent cathode having an ITO-Ag-ITO stack structure reduces a transmissivity in the case where the translucent cathode having the stack structure is independent. However, as is known from the results of simulations to be described later (FIG. 11 etc.), the following knowledge was obtained: an excellent light extraction efficiency was achieved in some cases among the cases using a metal layer that is thick to some extent, in the case where the translucent cathode having the stack structure is embedded into a blue light emitting element. This underlying knowledge formed the basis of the present disclosure. The present disclosure was achieved based not only on conventional knowledge of focusing on the film thicknesses of the metal layer and the translucent conductive layers which form the stack structure of the translucent cathode, but also based on the results of keen studies on refractivity and film thickness ranges in each of which light extraction efficiencies are excellent even when the metal layer which form the translucent cathode has a certain film thickness by (i) setting, to be within a predetermined range, the differences in refractivity between the metal layer and the translucent conductive layers adjacent to the metal layer, (ii) setting, to be within a predetermined range, the refractivity and film thickness of the first translucent conductive layer (first conductive layer) arranged at the functional layer side in the stack structure of the translucent cathode, and (iii) setting, to be within a predetermined range, the optical film thickness of the functional layer at the first electrode side.

[Aspects of the Present Invention]

An organic light emitting element according to an aspect of the present disclosure includes; a first electrode which reflects incident light; a second electrode which is disposed opposing the first electrode, and allows the incident light to pass through; an organic light emitting layer which is disposed between the first electrode and the second electrode, and emits at least blue light; a first functional layer which is disposed between the first electrode and the organic light emitting layer, and formed of one or more layers; and a second functional layer which is disposed between the organic light emitting layer and the second electrode, and formed of one or more layers.

The following paths are formed in the organic light emitting element: a first optical path in which part of the blue light emitted from the organic light emitting layer enters the first electrode through the first functional layer, is reflected by the first electrode, and is emitted outside through the first functional layer, the organic light emitting layer, and the second functional layer; and a second optical path in which remaining part of the blue light emitted from the organic light emitting layer travels to the second electrode through the second functional layer without travelling toward the first electrode, and is emitted outside through the second electrode.

In addition, the second electrode at the light extraction side is a stack of a first conductive layer made of a translucent conductive material, a metal layer, and a second conductive material made of a translucent conductive material stacked in this order from the side close to the organic light emitting layer. With this, it is possible to obtain an increased conductivity compared to the case in which the second electrode is made only of a translucent conductive material, thereby reducing a sheet resistance value.

In the organic light emitting element including the second electrode having a stack structure at the light extraction side and a resonator structure, the first functional layers each are formed to have an optical film thickness in a corresponding one of the ranges (1) to (3) below, with consideration of causing resonation of light passing through the two optical paths and extracting blue light having an excellent chromaticity with a high light extraction efficiency.

In addition, the first conductive layer and the metal layer in each of (1) to (3) are set to have a refractivity and a film thickness which are different, as a whole, from those in any of the other ones of (1) to (3) as described separately. With these settings, it is possible to obtain a further increased light extraction efficiency for blue light having an excellent chromaticity.

(1) The first functional layer is formed to have an optical film thickness ranging from 48 nm to 62 mm. This optical film thickness corresponds to 0.5 cav. described later. With this, it is possible to extract blue light having an excellent chromaticity with a high light extraction efficiency.

In this case, the first conductive layer has a refractivity ranging from 2.0 to 2.4, and has a film thickness ranging from 85 nm to 97 nm. The metal layer has a refractivity which is different by 0 to 2.0 from the refractivity of the first conductive layer, and has a film thickness ranging from 2 nm to 22 nm.

By setting this range, it is possible to obtain a further increased light extraction efficiency for blue light having an excellent chromaticity.

In addition, it is possible to obtain a blue light extraction efficiency in a more reliable manner by means of the second electrode in which, when the film thickness of the first conductive layer is X3, and the film thickness of the metal layer is Y3, X3 and Y3 each take a value within a range expressed by a corresponding one of the following Expressions 1 which are relational expressions:

$$X3=Rx\cos\theta\cos\phi-Ry\sin\theta\sin\phi+X0$$

$$Y3=Rx\cos\theta\sin\phi+Ry\sin\theta\cos\phi+Y0 \quad \text{[Expressions 1]}$$

Here, θ is a variable parameter which changes within the range of $0\le\theta\le2\pi$, X0=91.4, Y0=10.7, Rx=5.6, Ry=9.6, and $\phi=0$ are satisfied.

(2) The first functional layer is formed to have an optical film thickness ranging from 272 nm to 286 nm. This optical film thickness corresponds to 1.5 cav. described later. With this, it is possible to extract blue light having an excellent chromaticity with a high light extraction efficiency.

In this case, the first conductive layer has a refractivity ranging from 2.0 to 2.4, and has a film thickness ranging from 86 nm to 97 nm. The metal layer has a refractivity which is different by 0 to 2.0 from the refractivity of the first conductive layer, and has a film thickness ranging from 8 nm to 16 nm. With these settings within the range, it is possible to obtain a further increased light extraction efficiency for blue light having an excellent chromaticity.

In addition, it is possible to obtain a blue light extraction efficiency in a more reliable manner by means of the second electrode in which, when the film thickness of the first conductive layer is X3, and the film thickness of the metal layer is Y3, X3 and Y3 each take a value within a range expressed by a corresponding one of the following expressions 2 which are relational expressions:

$$X3=Rx\cos\theta\cos\phi-Ry\sin\theta\sin\phi+X0$$

$$Y3=Rx\cos\theta\sin\phi+Ry\sin\theta\cos\phi+Y0 \quad \text{[Expressions 2]}$$

Here, $0\le\theta\le2\pi$, X0=91.3, Y0=11.9, Rx=5.3, Ry=4.4, and $\phi=0$ (rad) are satisfied.

(3) The first functional layer is formed to have an optical film thickness ranging from 17 nm to 33 am. This optical film thickness corresponds to 0.5 cav. described later. With this, it is possible to extract blue light having an excellent chromaticity with a high light extraction efficiency.

In this case, the first conductive layer has a refractivity ranging from 2.0 to 2.4, and has a film thickness ranging from 35 nm to 65 nm. The metal layer has a refractivity which is different by 0 to 2.0 from the refractivity of the first conductive layer, and has a film thickness ranging from 8 nm to 22 nm. With these settings within the range, it is possible to obtain a further increased light extraction efficiency for blue light having an excellent chromaticity.

When the film thickness of the first conductive layer is X3, and the film thickness of the metal layer is Y3 in the second electrode, X3 and Y3 each take a value within the range expressed by a corresponding one of the following Expressions 3 which are relational expressions. Thus, it is possible to obtain a blue light extraction efficiency in a more reliable manner.

$$X3=Rx\cos\theta\cos\phi-Ry\sin\theta\sin\phi+X0$$

$$Y3=Rx\cos\theta\sin\phi+Ry\sin\theta\cos\phi+Y0 \quad \text{[Expressions 3]}$$

Here, $0\le\theta\le2\pi$, X0=50, Y0=15, Rx=15, Ry=5, and $\phi=9.7$ (red) are satisfied.

In the organic light emitting element according to each aspect, it is desirable that the metal layer have a film thickness of 10 nm or more in order to reduce a sheet resistance value.

In the organic light emitting element according to each aspect, in order to correct chromaticity of light which is emitted outside through the second electrode, it is good that the organic light emitting element may further include a blue color filter which allows the light to pass through. The blue light extracted from the organic light emitting element has an excellent chromaticity as described above. Therefore, even when chromaticity is corrected by providing a color filter having a high transmissivity, it is possible to obtain a target chromaticity using the color filter.

The organic light emitting display panel according to another aspect of the present disclosure includes an organic light emitting element according to each of the aspects. The organic light emitting display panel according to this aspect can be an organic light emitting display panel having a further increased light extraction efficiency for blue light having an excellent chromaticity.

The organic light emitting display apparatus according to another aspect of the present disclosure includes an organic light emitting display panel according to any of the aspects. The organic light emitting display apparatus according to this aspect can be an organic light emitting display apparatus having a further increased light extraction efficiency for blue light having an excellent chromaticity.

Hereinafter, embodiments are described.

Embodiment 1

In Embodiment 1, an organic display panel having a top emission structure is described.

[Organic Display Panel]

Figure 1:
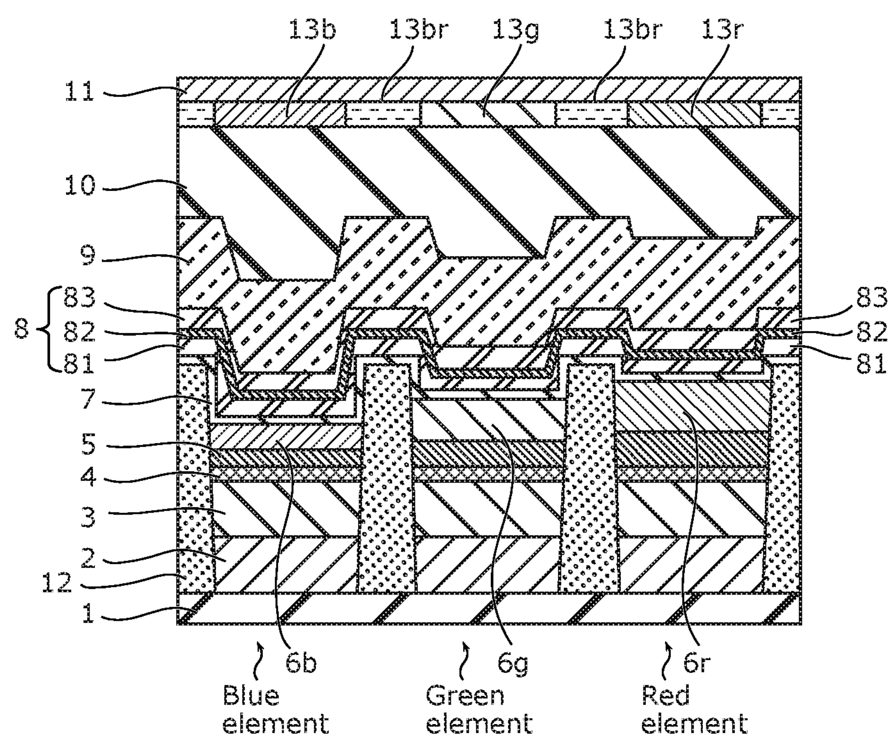
FIG. 1 is a cross-sectional diagram which schematically illustrates a pixel structure of an organic display panel according to Embodiment 1.

FIG. 1 is a cross-sectional diagram which schematically illustrates a pixel structure of the organic display panel according to Embodiment 1.

In this organic display panel, light emitting elements each of which emits R (red), G (green), or B (blue) light are arranged regularly in row and column directions in a matrix.

Each of blue light emitting elements includes: a substrate 1; a reflecting electrode (hereinafter, photoanode) 2; a translucent conductive layer 3; a hole injecting layer 4; a hole transporting layer 5; an organic light emitting layer 6*b*; an electron transporting layer 7; a translucent electrode (hereinafter, translucent cathode) 8, a thin-film sealing layer 9; a resin sealing layer 10; and a substrate 11. Each of green light emitting elements has the same structure as that of each blue light emitting element, except for those in an organic light emitting layer 6*g*. Each of red light emitting elements has the same structure as that of each blue light emitting element, except for those in an organic light emitting layer 6*r*. In this example, in each of the light emitting elements each of which emits light having one of the colors, the substrate 1, the electron transporting layer 7, the translucent cathode 8, the thin-film sealing layer 9, and the resin sealing layer 10 are in common, and the other layers are segmented by a bank 12. Hereinafter, the organic light emitting layers 6*b*, 6*g*, and 6*r* are described integrally as an organic light emitting layer 6.

In addition, color filters 13*b*, 13*g*, and 13*r* are provided.

[Specific Example of Each Layer]

<Substrate>

The substrate 1 is, for example, a thin film transistor (TFT) substrate.

Materials for the substrate 1 include, for example: (i) glass boards and quartz boards made of soda glass, nonfluorescent glass, phosphoric acid-based glass, boric acid-based glass, or the like; (ii) plastic boards or plastic films made of an acrylic resin, a styrene-based resin, a polycarbonate resin, an epoxy resin, polyethylene, polyester, a silicone-based resin, or the like; and (iii) metal boards or metal foil made of alumina or the like.

<Bank>

It is only necessary for the bank 12 to be made of an insulative material, and may be resistant against organic solvents. In addition, the bank 12 may be subjected to etching, baking, or the like, and thus may be formed using a material that is highly resistant against the processing. The bank 12 may be made of an organic material such as a resin or an inorganic material such as glass. An acrylic resin, a polyimide resin, a novolac-type phenolic resin, or the like can be used as an organic material, and a silicon oxide ($SiO_2$), a silicon nitride ($Si_3N_4$), or the like can be used as an inorganic material.

<Photoanode>

The photoanode 2 is electrically connected to TFTs arranged above the substrate 1, functions as a positive electrode of a light emitting element, and has a function of reflecting light emitted from the organic light emitting layers 6*b*, 6*g*, and 6*r* toward the photoanode 2. The reflection function may be exerted by a constituent material in the photoanode 2, or by providing a reflective coating on the surface of the photoanode 2. The photoanode 2 is made of, for example, aluminum (Al), silver (Ag), an alloy of silver, palladium, and copper (APC), an alloy of silver, rubidium, and gold (ARA), an alloy of molybdenum and chrome (MoCr), and an alloy of nickel and chrome (NiCr).

<Translucent Conductive Layer>

The translucent conductive layer 3 functions as a protective layer which prevents natural oxidation of the photoanode 2 in manufacturing processes. The translucent conductive layer 3 may be made of a conductive material having a sufficient translucency to light generated in the organic light emitting layers 6*b*, 6*g*, and 6*r*. The conductive material may be, for example, ITO or IZO. This is because an excellent conductivity can be obtained even when films are formed at a room temperature.

<Hole Injecting Layer>

The hole injecting layer 4 has a function of injecting holes into the organic light emitting layers 6*b*, 6*g*, and 6*r*. For example, the hole injecting layer 4 is made of an oxide of a transition metal such as a tungsten oxide ($WO_x$), a molybdenum oxide ($MoO_x$), and a molybdenum-tungsten oxide ($Mo_xW_yO_z$). By forming the hole injecting layer 4 using such an oxide of a transition metal, it is possible to increase voltage-current density characteristics, and also increases current density and light emission intensity. It is to be noted that a metal compound such as a nitride of a transition metal is available other than the above.

<Hole Transporting Layer>

Materials for the hole transporting layer 5 include: triazole derivatives, oxadiazole derivatives, imidazole derivatives, polyarylalkane derivatives, pyrazoline derivatives, pyrazolone derivatives, phenylenediarnine derivatives, arylamine derivatives, amino-substituted chalcone derivatives, oxazole derivatives, styryl anthracene derivatives, fluorenone derivatives, hydrazone derivatives, stilbene derivatives, porphyrin-based compounds, aromatic tertiary amine compounds, styryl amine compounds, butadiene compounds, polystyrene derivatives, triphenylmethane derivatives, and tetraphenyl benzine derivatives. The hole transporting layer 5 may be made of: a porphyrin compound, an aromatic tertiary amine compound, or a styrylamine compound.

<Organic Light Emitting Layer>

Materials for the organic light emitting layers 6*b*, 6*g*, and 6*r* are fluorescent substances such as: oxinoid compounds, perylene compounds, coumarin compounds, azakumarin compounds, oxazole compounds, oxadiazole compounds, perynone compounds, pyrrolopyrrole compounds, naphthalene compounds, anthracene compounds, fluorene compounds, fluoranthene compounds, tetracene compounds, pyrene compounds, coronene compounds, quinolone compounds, azakinoron compounds, pyrazoline derivatives, pyrazolone derivatives, rhodamine compounds, chrysene compounds, phenanthrene compounds, cyclopentadiene compounds, stilbene compounds, diphenyl quinone compounds, styryl compounds, butadiene compounds, dicyanomethylenepyran compounds, dicyanomethylenethiopyran compounds, fluorescein compounds, pyrylium compounds, thiapyrylium compounds, serena pyrylium compounds, teruropiririumu compounds, aromatic Alder diene compounds, oligophenylene compounds, thioxanthene compounds, anthracene compounds, cyanine compounds, acridine compounds, metal complexes of 8-hydroxy quinoline compounds, metal complexes of 2-bipyridine compounds, complexes of Schiff salt and Group III metals, oxine metal complexes, and rare earth metal complexes.

<Electron Transporting Layer>

Materials for the electron transporting layer 7 include: nitro-substituted fluorene derivatives, thiopyran dioxide derivatives, jifekinon derivatives, perylene tetracarboxylic derivatives, anthraquinodimethane derivative, fluorenylidenemethane derivatives, anthrone derivatives, oxadiazole derivatives, perinone derivatives, and quinoline complex derivatives.

It is to be noted that, in order to further increase efficiency in the injection of electrons, an alkaline metal such as Na, Ba, and Ca or an alkaline earth metal may be doped to a material that forms the electron transporting layer.

<Translucent Cathode>

The translucent cathode 8 functions as a negative electrode of an organic EL element. The translucent cathode 8 is made of a conductive material that is translucent to light generated in the organic light emitting layers 6*b*, 6*g*, and 6*r*.

The translucent cathode 8 is a stack of a first translucent conductive layer 81 made of a translucent conductive material, a metal layer 82, a second translucent conductive layer 83 made of a translucent conductive material stacked in this order.

The materials (translucent conductive materials) of the first translucent conductive layer 81 and the second translucent conductive layer 83 are, for example, an indium tin oxide (ITO) and an indium zinc oxide (IZO).

Materials for the metal layer 82 can be listed as follows: silver (Ag) typically, gold (Au), platinum (Pt), palladium (Pd), nickel (Ni), copper (Cu), aluminum (Al), or an alloy of any of these.

<Thin-Film Sealing Layer>

The thin-film sealing layer 9 has a function of preventing each layer sandwiched with the substrate 1 from being exposed to water and air. The thin-film sealing layer 9 is made of, for example, a silicon nitride (SiN), a silicon oxynitride (SiON), or a resin.

<Resin Sealing Layer>

The resin sealing layer 10 has functions of attaching a rear panel composed of layers starting with a layer on the substrate 1 and ending with the thin-film sealing layer 9 and a substrate 11 above which color filters 13*b*, 13*g*, and 13*r* are formed, and preventing the layers from being exposed to water and air. The resin sealing layer 10 is made of, for example, a resin adhesive.

<Color Filter (CF)>

The color filters 13*b*, 13*g*, and 13*r* have functions of allowing passage of light emitted from the light emitting elements each of which emits light having one of the colors, and correcting the chromaticity.

<Optical Resonator Structure>

In each of the light emitting elements which emits R, G, or B light, a corresponding one of the different-color organic light emitting layers 6*b*, 6*g*, and 6*r* is present between the translucent cathode 8 and the photoanode 2, and as described below, an optical resonator structure is formed for causing resonation of light from the organic light emitting layers 6*h*, 6*g*, and 6*r*, and emitting the light from the side of the translucent cathode 8.

The light generated in the organic light emitting layers 6*b*, 6*g*, and 6*r* is emitted outside from the translucent cathode 8. The light includes both of the following components: "direct light" which is directly emitted from the organic light emitting layers 6*b*, 6*g*, and 6*r* to the translucent cathode 8; and "reflected light" which is emitted from the organic light emitting layers 6*b*, 6*g*, and 6*r* toward the photoanode 2, is reflected by the photoanode 2, and goes to the translucent cathode 8.

Figure 2:
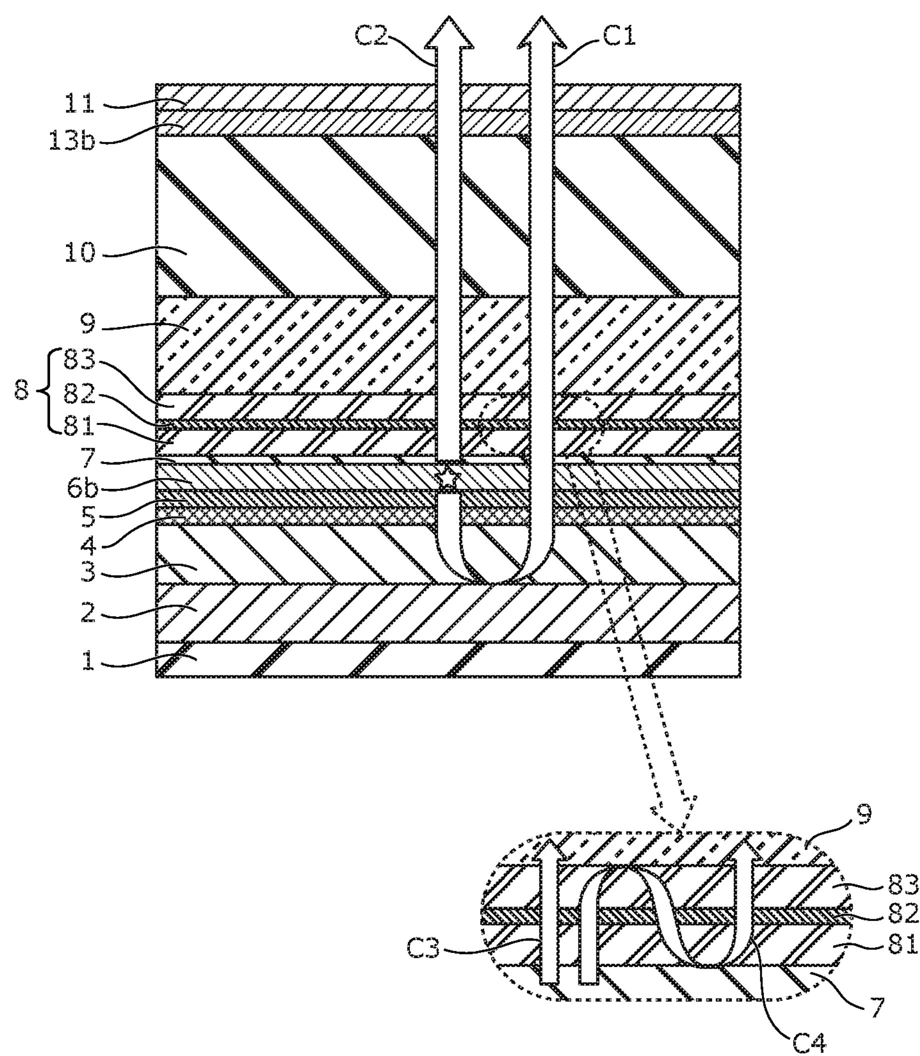
FIG. 2 is a diagram illustrating direct light and reflected light in an optical resonator structure formed on a light emitting element.

FIG. 2 is a diagram illustrating direct light and reflected light in an optical resonator structure formed in a light emitting element.

This diagram illustrates a blue element having an organic blue light emitting layer 6*b*. However, this is true of a red element having an organic red light emitting layer 6*r*, and a green element having an organic green light emitting layer 6*g*.

In the optical resonator structure of the light emitting element, the following two optical paths are formed. One of the two is a first optical path C2 in which part of light emitted from the organic light emitting layer 6 travels toward translucent cathode 8 without travelling toward the photoanode 2, and the light is emitted to the outside of the light emitting element through the translucent cathode 8. The other is a second optical path C1 in which the remaining part of the light emitted from the organic light emitting layer 6 travels toward the photoanode 2, and after the light is reflected from the photoanode 2, the light is emitted to the outside of the light emitting element through the organic light emitting layer 6 and the translucent cathode 8.

Basically, an optical film thickness L between the organic light emitting layers 6*b*, 6*g*, and 6*r* and the photoanode 2 is set so that light components corresponding to the colors enhance each other through interference between the direct light and the reflected light.

This optical film thickness L is a total optical distance (expressed by a product of a film thickness and a refractivity, and the unit is [nm]) of three functional layers (the translucent conductive layer 3, the hole injecting layer 4, and the hole transporting layer 5) sandwiched between the organic light emitting elements 6*b*, 6*g*, and 6*r* and the photoanode 2.

As the results of the studies, the Inventors found that the chromaticity of extracted blue light was not close to a target chromaticity when a light extraction efficiency is a local maximum value in a blue light emitting element, and the chromaticity of extracted blue light favorably tends to be rather close to the target chromaticity in the case of extracting blue light having a small chromaticity y value by shifting an optical film thickness L from the optical film thickness L which provides the light extraction efficiency of the local maximum value.

In this embodiment, as described later, this optical film thickness L is set prioritizing also the chromaticity y value, not based only on the light extraction efficiency. Stated differently, the optical film thickness L is set so that a high luminance/y value as an indicator is obtained.

[Overall Configuration and Appearance of Display Apparatus]

Figure 3:
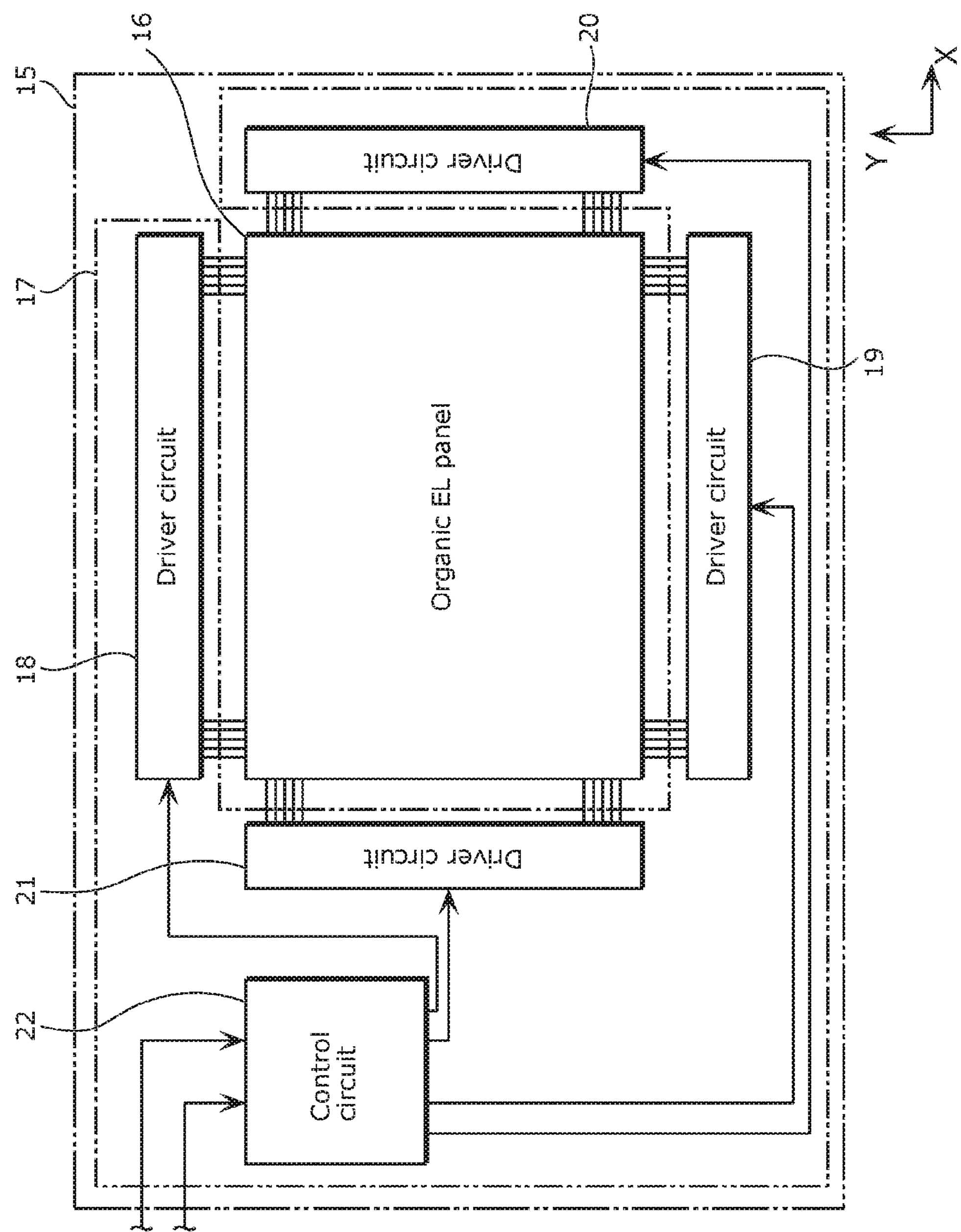
FIG. 3 is a diagram illustrating functional blocks of a display apparatus according to an embodiment.
Figure 4:
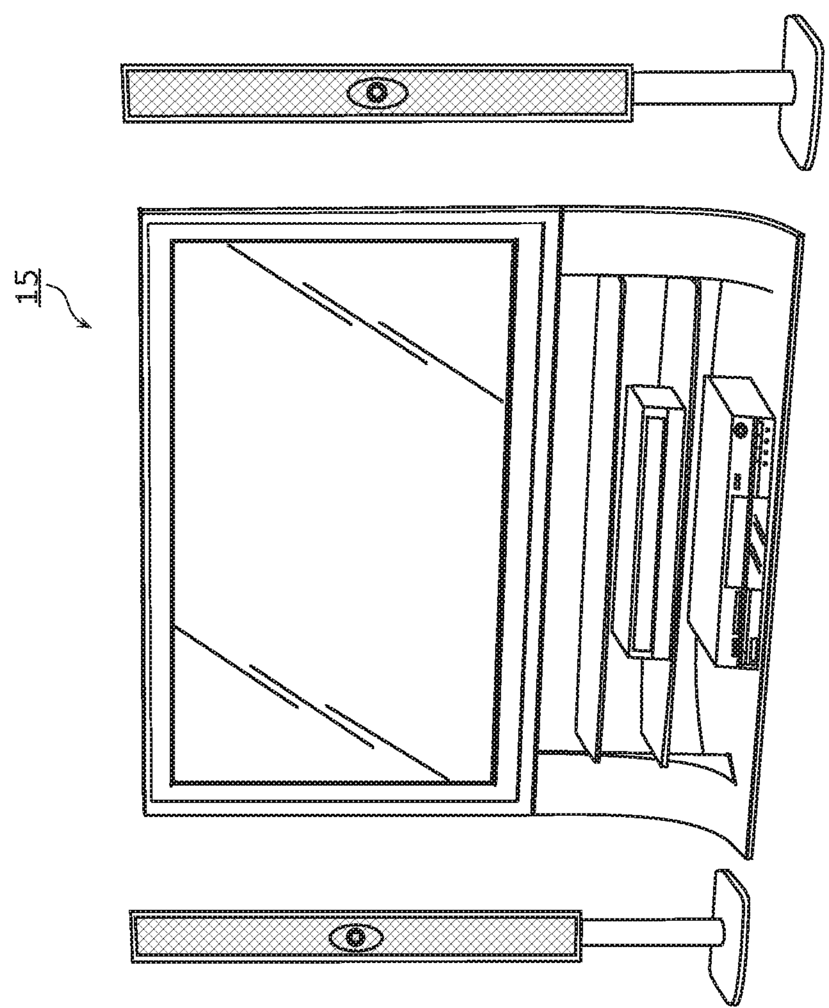
FIG. 4 is a diagram illustrating an appearance of a display apparatus according to the embodiment.

FIG. 3 is a diagram illustrating functional blocks of a display apparatus according to this embodiment. FIG. 4 is a diagram illustrating the appearance of the display apparatus.

The organic display apparatus (organic light emitting display apparatus) 15 includes: an organic display panel 16; and a driver control unit 17 connected thereto. The organic display panel (organic light emitting display panel) 16 includes the above-described blue, green, and red light emitting elements arranged in X and Y directions in a matrix on a display screen thereof. The driver control unit 17 includes: four driver circuits 18 to 21, and a control circuit 22. However, the arrangement of the driver control unit 17 with respect to the organic display panel 16 in the organic display apparatus 15 is not limited thereto.

The control circuit 22 receives a video signal from outside, and outputs a control signal based on the video signal to the driver circuits (scanning line driver circuits) 20 and 21, and driver circuits (signal line driver circuits) 18 and 19.

The driver circuits 20 and 21 are connected to a plurality of scanning lines arranged in the X direction, and controls conduction and non-conduction of a switch transistor provided correspondingly to the light emitting element according to Embodiment 1 by outputting a scanning signal to the scanning lines.

The driver circuits 18 and 19 are connected to a plurality of data lines arranged in the Y direction, and outputs a data voltage based on the video signal to the light emitting element according to Embodiment 1.

The organic display panel 16 includes a plurality of blue, green, and red light emitting elements arranged in the X and Y directions in the matrix, and displays an image based on the video signal input to the organic display apparatus 15 from outside.

The organic display panel configured in this way includes an organic light emitting element according to any aspect of the present disclosure. In this way, as is made clear from descriptions in the embodiment below, it is possible to achieve an organic light emitting display panel which provides a further increased light extraction efficiency for blue light having an excellent chromaticity.

The organic light emitting display apparatus configured in this way includes an organic light emitting display panel having organic light emitting elements according to any aspect of the present disclosure. In this way, as is made clear from descriptions below in the embodiment, it is possible to achieve an organic light emitting display apparatus which provides a further increased light extraction efficiency for blue light having an excellent chromaticity.

[Method for Manufacturing Organic Display Panel]

A method for manufacturing an organic display panel is described with reference to FIGS. 5 and 6.

Figure 5:
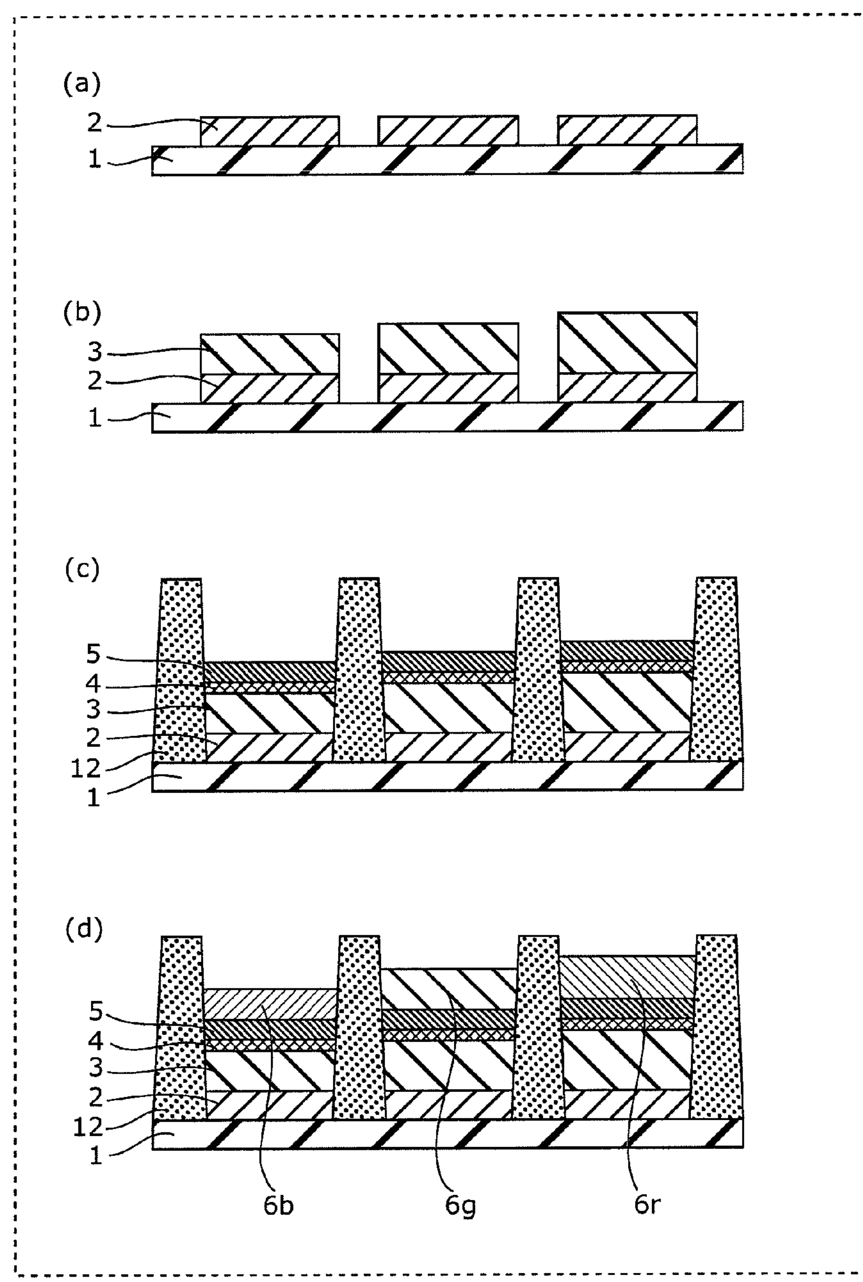
FIG. 5 is composed of (a) to (d) which are diagrams illustrating a method for manufacturing the display apparatus according to the embodiment.

First, a photoanode 2 is formed on a substrate 1 according to a vapor deposition method or a sputtering method ((a) in FIG. 5). Next, a translucent conductive layer 3 is formed on the photoanode 2 according to a vapor deposition method or a sputtering method ((b) in FIG. 5). At this time, the film thickness of a translucent conductive layer 3 is arbitrarily adjusted to be within any of the above-described ranges.

Next, a hole injecting layer 4 is formed on the translucent conductive layer 3 according to, for example, a sputtering method or the like, and a bank 12 is formed. Furthermore, a hole transporting layer 5 is formed on the hole injecting layer 4 according to, for example, an ink jet method or the like ((c) in FIG. 5).

Next, organic light emitting layers **6*b*, 6*g*, and 6*r* are formed on the hole transporting layer 5 ((d) in FIG. 5**).

Figure 6:
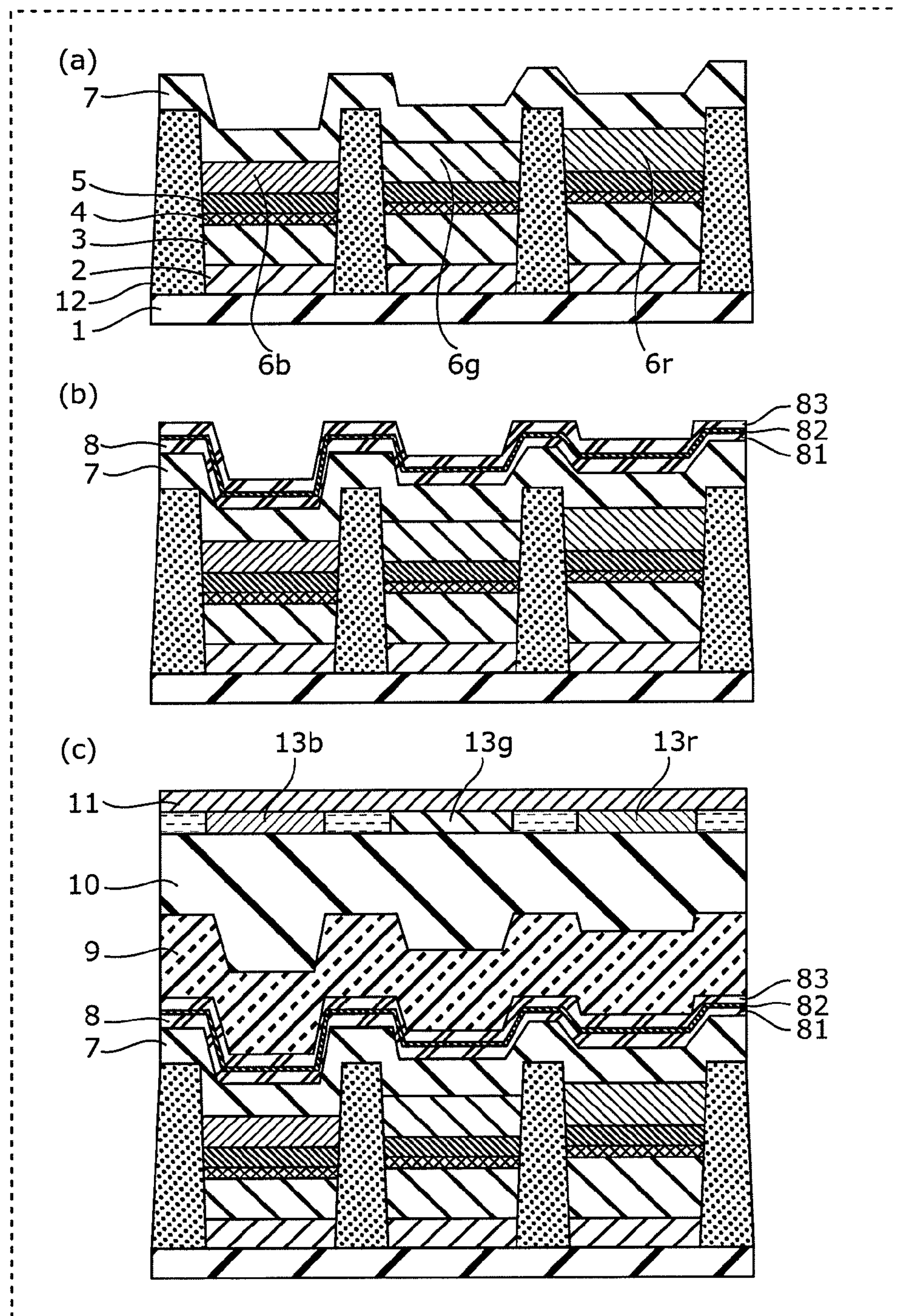
FIG. 6 is composed of (a) to (c) which are diagrams illustrating a method for manufacturing the display apparatus according to the embodiment.

Next, an electron transporting layer 7 is formed on the organic light emitting layers **6*b*, 6*g*, and 6*r* ((a) in FIG. 6**).

Next, a translucent cathode 8 is formed on the electron transporting layer 7 by stacking a first translucent conductive layer 81, a metal layer 82, and a second translucent conductive layer 83 in this order ((b) in FIG. 6).

The first translucent conductive layer 81 and the second translucent conductive layer 83 are formed by, for example, forming an ITO layer according to a vacuum vapor deposition method, a sputtering method, a reactive sputtering method, an ion plating method, a plasma CVD method, a laser CVD method, a thermal CVD method, or the like.

Metals used to form a metal layer 82 can be listed for example as follows: silver, gold, platinum, copper, palladium, stannum, nickel, aluminum, etc. Silver, gold, platinum, palladium, nickel, bismuth, copper, aluminum are particularly suitable. Alternatively, alloys each containing at least one of these metals is also possible.

A vapor deposition method, a sputtering method, and the like can be listed as methods for forming a metal film.

Here, the film thicknesses of the first translucent conductive layer 81, the metal layer 82, and the second translucent conductive layer 83 which form the translucent cathode 8 are arbitrarily adjusted to be within any of the above-described ranges.

Next, a thin-film sealing layer 9 is formed on the translucent cathode 8, and the substrate 11 above which the color filters **13*b*, 13*g*, and 13*r* are formed is attached thereto using a resin sealing layer 10 ((c) in FIG. 6**).

[Optical Film Thickness L Between Organic Light Emitting Layer 6 and Photoanode 2]

In the resonator structure in the above-described blue light emitting element, when the optical film thickness L between the organic light emitting layer 6 and the photoanode 2 is different, a light extraction efficiency for blue light to be extracted is different and the chromaticity thereof is also different.

Normally, in the resonator structure, the optical film thickness L of the first functional layer is adjusted so that a light extraction efficiency shows a local maximum value. For convenience of explanation, the resonator structures with which light extraction efficiencies show local maximum values are referred to as 1st cavity (hereinafter, described as 1st cav.) and 2nd cavity (hereinafter, described as 2nd cav.) in ascending order of optical film thicknesses L of the first functional layers. Stated differently, 1st cav. corresponds to the minimum optical film thickness L in the optical film thicknesses L with which the light extraction efficiencies show the local maximum values, and 2nd cav. corresponds to the second minimum optical film thickness L in the optical film thicknesses L with which the light extraction efficiencies show the local maximum values.

The light extraction efficiencies are higher in the case of 1st cav. than in the case of 2nd cav.

In FIG. 7, (a) is a graph showing results of simulations of the efficiencies of extracting blue light from blue light emitting elements (without any color filter) which have been obtained using hole injecting layers 4 having different film thicknesses ranging from 0 nm to 200 nm. The horizontal axis denotes the film thickness of the hole injecting layer 4, and the perpendicular axis denotes the light extraction efficiency. These simulations are known as optical simulations using a matrix method, and are performed on the blue light emitting elements according to Example 1a illustrated in FIG. 9. In the blue light emitting elements, the layers other than the hole injecting layers 4 are set to have the same film thicknesses.

The optical film thickness L of the first functional layer changes in proportion to a change in the film thickness of the hole injecting layer 4. Thus, the graph (a) in FIG. 7 shows the relationships between the optical film thicknesses L of the first functional layers and the light extraction efficiencies.

In FIG. 7, (b) is a graph showing results of simulations of variation in the chromaticity (x values and y values in the CIE chromaticity system) of light extracted from the blue light emitting elements which are obtained using hole injecting layers 4 having different film thicknesses in the same manner (with this, the optical film thicknesses of the first functional layers are also different). The horizontal axis denotes the film thickness of the hole injecting layers 4, and the perpendicular axis denotes the chromaticity of light extracted from the blue light emitting element.

In each of the cases of 1st cav. and 2nd cav., the light extraction efficiency is high as illustrated in (a) of FIG. 7, but a chromaticity y value is large as illustrated in (b) of FIG. 7.

Here, as a chromaticity of blue light to be finally extracted from a blue light emitting element, a y value of approximately 0.08 or below is regarded as a general chromaticity target. Accordingly, in the case where a chromaticity y value for blue light extracted from the blue light emitting element is distant from the target chromaticity, there is a need to significantly correct the chromaticity using a color filter (CF). In this case, since a color filter having a low transmissivity needs to be used, a resulting light extraction efficiency of light passed through the color filter decreases significantly even when the light extraction efficiency of light originally extracted from the blue light emitting element is large.

On the other hand, as illustrated in (b) of FIG. 7, a film thickness with which a sufficiently small chromaticity y value is obtained (the film thickness with which the chromaticity y value is 0.08 or below) can be found by shifting the film thicknesses of the hole injecting layers 4 from the film thicknesses corresponding to 1st caw, and 2nd cav. to smaller film thicknesses. This film thickness is referred to as a film thickness corresponding to 0.5 cav.

In the case of the film thickness corresponding to 0.5 cav., the efficiency of extracting blue light from the blue light emitting element is smaller than in the cases of 1st cav. and 2nd cav., but the chromaticity y value is also small, and thus the luminance/y value is the local maximum value around there.

Likewise, a film thickness (i) which is larger than the film thickness corresponding to 1st cav. and smaller than the film thickness corresponding to 2nd cav., and (ii) with which a sufficiently small chromaticity y value is obtained (the film thickness with which the chromaticity value is 0.08 or below) is referred to as a film thickness corresponding to 1.5 cav.

As disclosed in Patent Literature 1, higher light extraction efficiencies of light passed through a color filter tend to be obtained in the case where blue light having a small chromaticity y value is extracted by adjusting the optical film thicknesses L of the first functional layers to the film thicknesses corresponding to 0.5 cav. and 1.5 cav. than to the optical film thicknesses corresponding to 1st cav. and 2nd cav.

For this reason, this embodiment employs, in the blue light emitting element, a resonator structure in which the optical film thickness L of the first functional layer between the organic light emitting layer 6 and the photoanode 2 is adjusted to either 0.5 cav. or 1.5 cav.

[Setting of Film Thicknesses of Layers in Translucent Cathode 8]

In an organic display panel according to this embodiment, each blue light emitting element has a resonator structure in which blue light having a small chromaticity y value is extracted from the blue light emitting element as described above. As illustrated in FIG. 2, light to be emitted outside (optical paths C1 and C2 in FIG. 2) includes light passing directly through the translucent cathode 8 and is emitted outside (optical path C3) and light reflected from the translucent cathode 8 in a multiplexed manner and is emitted outside (optical path C4).

Here, the light travelling through the optical paths C1 and C2 are reflected, in a multiplexed manner, from each layer of the first translucent conductive layer 81, the metal layer 82 and the second translucent conductive layer 83 which form the translucent cathode 8. The effect of interference caused when light beams are reflected in a multiplexed manner and interfere with each other is affected by the film thickness of each of the first translucent conductive layer 81, the metal layer 82, and the second translucent conductive layer 83 which form the translucent cathode 8. Accordingly, the light extraction efficiency of blue light is also affected by the film thickness of each of the first translucent conductive layer 81, the metal layer 82, and the second translucent conductive layer 83 which form the translucent cathode 8.

For this reason, in this embodiment, the film thickness of each of the first translucent conductive layer 81, the metal layer 82, and the second translucent conductive layer 83 which form the translucent cathode 8 is set so as to increase the light extraction efficiency of blue light to be extracted from the blue light emitting element. This point is described based on simulations in detail later.

[Film Thickness and Sheet Resistance Value of Each Layer Forming Translucent Cathode 8]

As illustrated in FIG. 8, samples of translucent cathodes each made of three layers of ITO-Ag-ITO (No. 1 to 7 in FIG. 8) are formed on a glass substrate so that the three layers in each of translucent cathodes have film thicknesses which are different, as a whole, from those in any of the other translucent cathodes.

A sheet resistance value and a transmissivity of light having a wavelength of 525 nm are measured for each of samples 1 to 7.

The sheet resistance value and transmissivity in each sample is as indicated in FIG. 8.

When Samples 5, 6, and 7 (No. 5, 6, and 7) are compared, the film thicknesses of the ITO layers positioned at both sides of the Ag thin films are different among Samples 5, 6, and 7 and are 50 nm, 75 nm, and 25 nm, respectively. However, the sheet resistance values are approximately the same values. As a result, it is found that the sheet resistance values are not affected by the film thicknesses of the ITO layers so much, and are determined mostly by the film thicknesses of the Ag layers.

This indicates that the sheet resistance value of the translucent cathode 8 is determined mostly by the film thickness of the metal layer 82, and does not depend so much on the film thicknesses of the first translucent conductive layer 81 and the second translucent conductive layer 83 which sandwich the metal layer 82.

In addition, based on the thicknesses of Ag films and sheet resistance values of Sample 2 (No. 2) and Sample 3 (No. 3) in FIG. 8, it is found that the sheet resistance value can be at 10Ω/□ or below by setting the film thickness of the metal layer 82 to be 10 nm or more.

In this way, in the organic display panel, it is possible to set the sheet resistance value of the translucent cathode 8 at 10Ω/□ or below by setting the film thickness of the metal layer 82 to be approximately 10 nm or more. In this way, it is possible to reduce a voltage decrease without providing any bus bar, and to contribute to achieve both reduction in voltage decrease and an increase in light extraction efficiency.

[EL Light Emission Simulations Regarding Blue Light Emitting Elements]

FIG. 9 illustrates results of simulations of blue light emitted from blue light emitting elements according to Example 1a in the case where, in the translucent, cathode 8 having a three-layer structure of ITO-Ag-ITO of each of the blue light emitting elements, the film thicknesses of the first translucent conductive layer 81, the metal layer 82, and the second translucent conductive layer 83 are different, as a whole, from those in the translucent cathode 8 of any of the other blue light emitting elements.

In these simulations, the following are used: a photoanode 2 made of aluminum, a translucent conductive layer 3 made of IZO, a BP105 manufactured by SUMATION CO., LTD., as an organic light emitting layer 5*b*.

Each of blue light emitting elements in Comparative example 1a' is basically the same as those of Example 1a except for the point that a translucent cathode 8 is made only of ITO. Simulations are performed regarding blue light emitted from the elements.

FIG. 9 illustrates refractivities, film thicknesses (nm), and optical film thicknesses (nm) of layers of each of Example 1a and Comparative example 1a' used in the simulations. In FIG. 9, each of optical path lengths is an optical film thickness of a corresponding one of the layers, and a value obtained by multiplying the refractivity and film thickness of the layer.

In addition, in each simulation, the hole injecting layer 4 in the resonator structure is formed to have a film thickness basically corresponding to 0.5 cav. FIG. 9 illustrates a case in which a total film thickness of the hole injecting layer 4, the hole transporting layer 5, and the translucent conductive layer 3 is 30 nm. In each simulation, the hole injecting layer 4 is set to have a different film thickness within the range from 10 to 20 nm corresponding to 0.5 cav. Since the hole injecting layer 4 has the different film thickness within the range, the optical film thickness L of the first functional layer (formed of the hole injecting layer 4, the hole transporting layer 5, and the translucent conductive layer 3) is different ranging from 48 to 62 nm.

The reason is described below. The total film thickness of the hole injecting layer 4, the hole transporting layer 5, and the translucent conductive layer 3 in the first functional layer is set to be the same at 30 nm, and the film thicknesses of the hole injecting layer 4, the hole transporting layer 5, and the translucent conductive layer 3 are set to be different as a whole. In this case, when the hole injecting layer 4 having the minimum refractivity in the first functional layer fully occupies the first functional layer, $1.6\times30$ nm=48 nm is satisfied. On the other hand, when the translucent conductive layer 3 having the maximum refractivity in the first functional layer fully occupies the first functional layer, $2.05\times30$ nm=62 nm is satisfied. Accordingly, when the film thicknesses of the hole injecting layer 4, the hole transporting layer 5, and the translucent conductive layer 3 are different as a whole whereas the total film thickness of the first functional layer are the same at 30 nm, the optical film thickness L of the first functional layer ranges from 48 nm to 62 nm.

"Luminance/y values" are calculated from the luminance and chromaticity of blue light obtained through simulations, and evaluations are made based on the obtained "luminance/y values".

The "luminance/y values" are used to evaluate the blue light emitting elements because the blue light emitted from each blue light emitting element is required to have both a high light extraction efficiency and a small chromaticity y value as described above. Stated differently, the "luminance/y values" of blue light emitted from the blue light emitting elements are indicators for evaluating balance between light extraction efficiencies and chromaticity (y values). Thus, as an indicated "luminance/y value" is larger, it is possible to extract blue light having an excellent chromaticity more efficiently.

Figure 10:
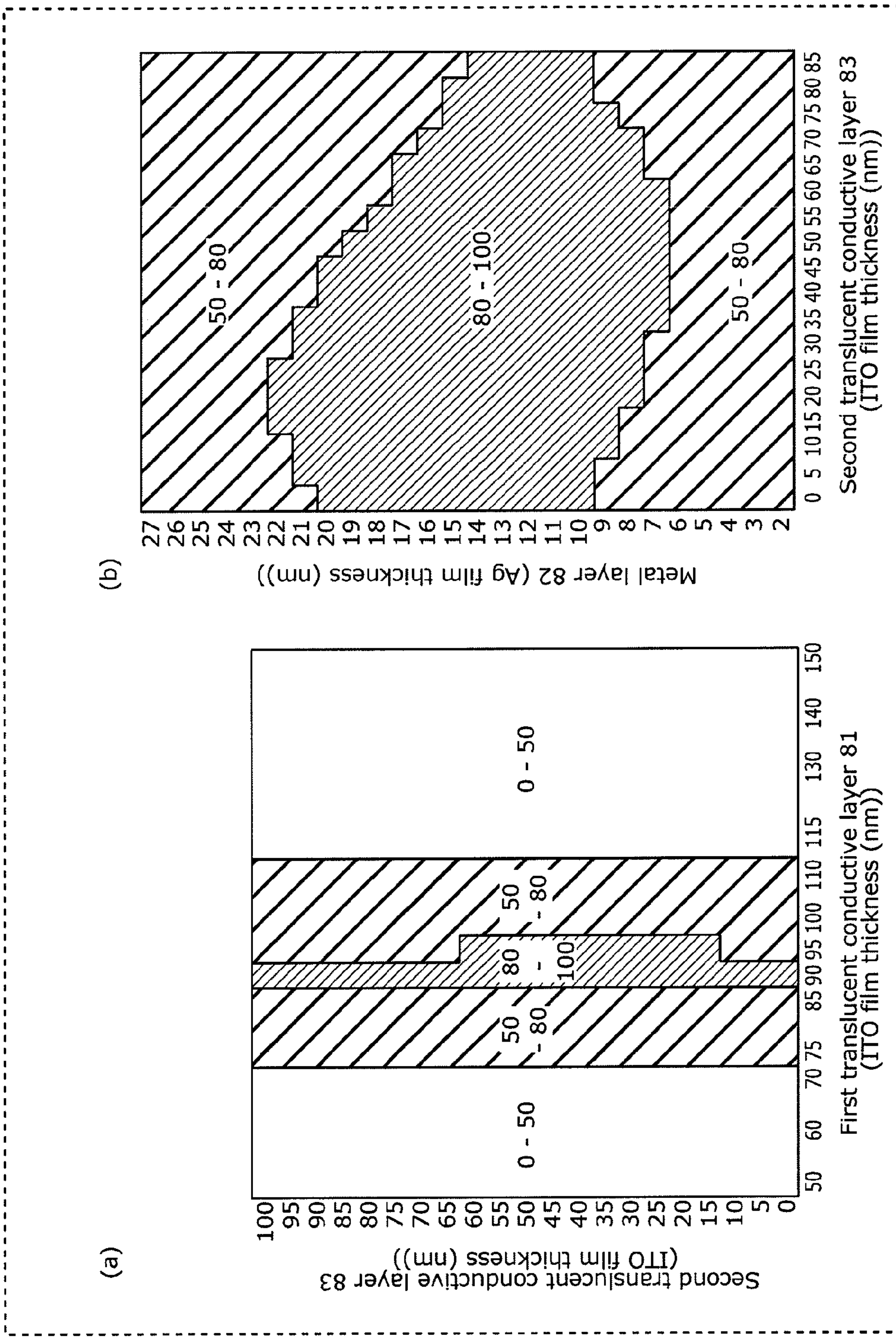
Figure 11:
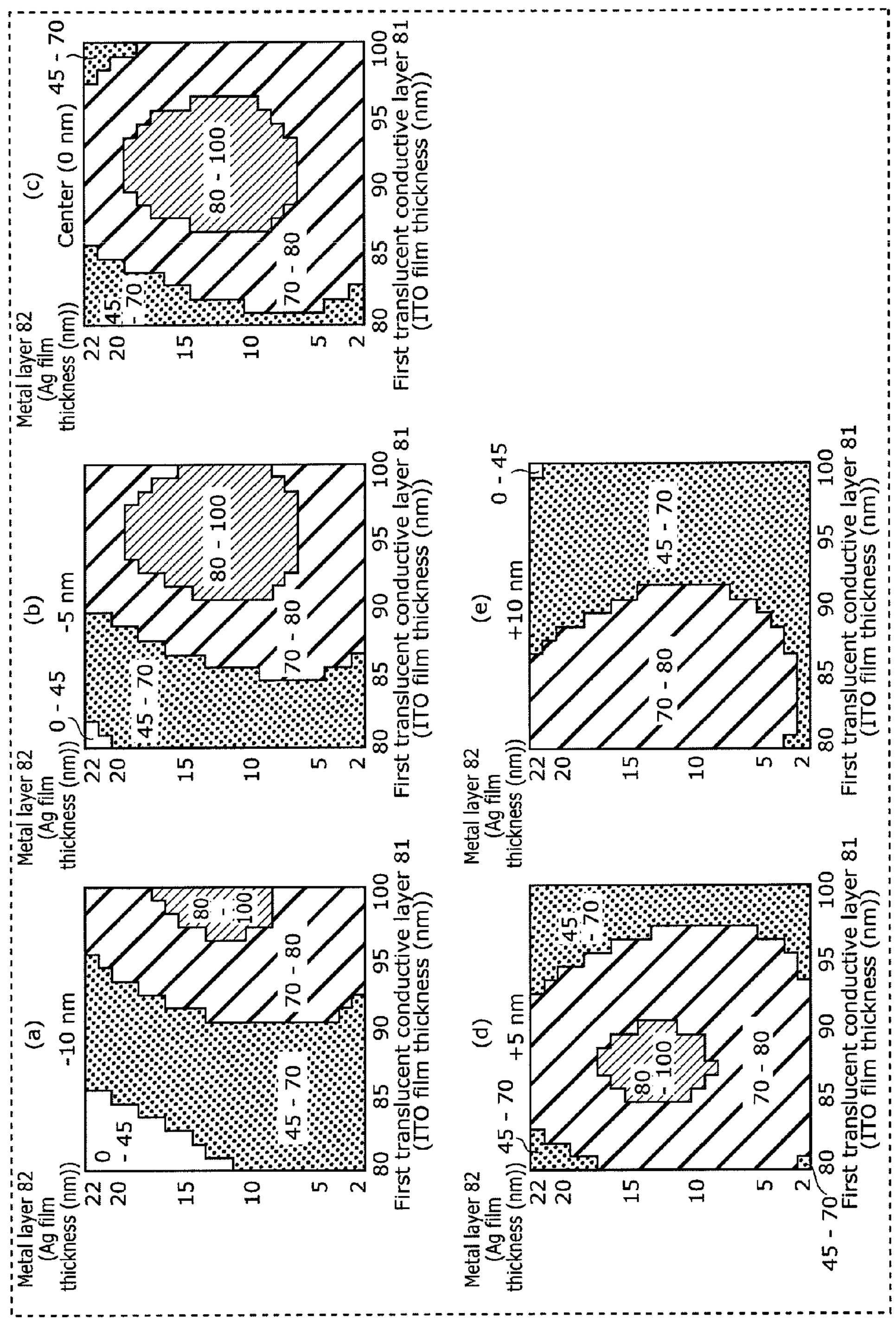

Each of (a) and (b) of FIG. 10 and (a) to (e) of FIG. 11 is a mapping diagram generated based on the results of simulations. In the mapping diagram, the whole area is divided into segments based on ranges of luminance/y values. Each of the mapping diagram is described below.

In FIG. 10, (a) is a diagram in which the film thicknesses of the first translucent conductive layers 81 and the film thicknesses of the second translucent conductive layers 83 are different at 5 nm intervals, resulting luminance/y values are plotted on orthogonal coordinates, and the whole area is divided into a segment in which luminance/y values are less than 50, a segment in which luminance/y values are no less than 50 and below 80, and a segment in which luminance/y values are no less than 80 and below 100.

In FIG. 10, (b) is a diagram in which the film thicknesses of the second translucent conductive layers 83 are different at 5 nm intervals and the film thicknesses of the metal layers 82 are different at 1 nm intervals and, resulting luminance/y values are plotted on orthogonal coordinates, and the whole area is divided into a segment in which luminance/y values are no less than 50 and below 80, and a segment in which luminance/y values are no less than 80 and below 100.

Based on (a) and (b) of FIG. 10, the following tendency can be found: the luminance/y values do not depend on the film thicknesses of the second translucent conductive layers 83 so much, but depend on the film thicknesses of the metal layers 82.

Next, each of (a) to (e) of FIG. 11 is a diagram in which the film thicknesses of the first translucent conductive layers 81 and the film thicknesses of the metal layers 82 are different at 5 nm intervals and 1 nm intervals, respectively, luminance/y values are plotted on orthogonal coordinates, and the whole area is divided into a segment in which luminance/y values are 45 or below, a segment in which luminance/y values are no less than 45 and below 70, a segment in which luminance/y values are no less than 70 and below 80, and a segment in which luminance/y values are no less than 80.

It is to be noted that the film thicknesses of the hole injecting layers 4 are larger in the order of (a) to (e). Accordingly, the optical film thicknesses L of the first functional layers also increase in this order.

[Consideration in the Case where Optical Film Thickness L of First Functional Layer is 0.5 Cav.]

In FIG. 11, (c) illustrates a case where the film thickness of the hole injecting layer 4 is at the center (approximately 15 nm) corresponding to 0.5 cav. illustrated in (a) and (b) of FIG. 7. In these simulations, the film thicknesses of the first functional layers are set to be the same (30 nm), and, under this condition, the film thicknesses of the hole injecting layers 4, the hole transporting layers 5, and the translucent conductive layers 3 are set to be different as a whole. When the refractivities of the respective layers are considered, the optical film thickness L of the first functional layer is 51 nm according to the following expression: $L=2.05\times5$ nm$+1.6\times15$ nm$+1.7\times10$ nm=51 nm. In FIG. 11, (c) is a mapping diagram in this case.

In FIG. 11, (a) is a mapping diagram in the case where the film thickness of the hole injecting layer 4 is a value obtained by subtracting 10 nm from the center (i.e., a value of 5 nm) of the film thickness range corresponding to 0.5 cav.; (b) is a mapping diagram in the case where the film thickness of the hole injecting layer 4 is a value obtained by subtracting 5 nm from the center (i.e., a value of 10 nm) of the film thickness range corresponding to 0.5 cav.; (c) is a mapping diagram in the case where the film thickness of the hole injecting layer 4 is a value corresponding to the center (i.e., a value of 0 nm) of the film thickness range corresponding to 0.5 cav.; (d) is a mapping diagram in the case where the film thickness of the hole injecting layer 4 is a value obtained by adding 5 nm to the center (i.e., a value of 20 nm) of the film thickness range corresponding to 1.5 cav.; (e) is a mapping diagram in the case where the film thickness of the hole injecting layer 4 is a value obtained by adding 10 nm to the center (i.e., a value of 25 nm) of the film thickness range corresponding to 0.5 cav.

The respective mapping diagrams show a tendency that the luminance/y values depend both on the film thicknesses of the first translucent conductive layers 81 and the film thicknesses of the metal layers 82. For this reason, the ranges of film thicknesses of the translucent conductive layers 81 and the film thicknesses of the metal layers 82 which provide excellent luminance/y values are calculated based on these mapping diagrams.

As described in FIG. 9, the EL blue light emitting element in Comparison example 1a has a luminance/y value of 57. Thus, when a luminance/y value in Example 1a is sufficiently larger than 57, it is possible to regard the light extraction effect as being increased.

For this reason, in the mapping diagrams of (a) to (e) of FIG. 11, the ranges of luminance/y values of 70 or more, that is, 1.2 times or more with respect to 57 (the ranges are the range of 70 to 80 and the range of 80 to 100) are regarded as ranges in which effects of increasing a light extraction efficiency are obtained.

The mapping diagrams (a) to (e) of FIG. 11 are compared. In the case of the metal layers 82, the film thickness ranges in which luminance/y values are 70 or more do not vary so much. On the other hand, in the case of the first translucent conductive layers 81, the film thickness ranges in which luminance/y values are 70 or more transit little by little in the order of (a) to (e) in the direction in which the film thicknesses decrease (in the left direction on the paper sheet of FIG. 11).

This shows that, in the proximity of an area in which the optical film thickness L of the first functional layer is 0.5 cav., when an optical film thickness L transits to the direction in which the film thickness decreases, the film thickness range in which the luminance/y value is 70 or more of the first translucent conductive layer 81 transits slightly to the direction in which the film thicknesses increase (in the right direction on the paper sheet of FIG. 11).

The range in which the film thickness of the hole injecting layer 4 illustrated in (a) of FIG. 7 corresponding to 0.5 cav. corresponds to the ranges illustrated in (b), (c), and (d) of FIG. 11, specifically, the ranges in which the film thicknesses of the hole injecting layer 4 are values within the range of ±5 nm from the center of the film thickness range corresponding to 0.5 cav.

For this reason, as for the first translucent conductive layer 81 and the metal layer 82, the film thickness range in which the luminance/y values are 70 or more is obtained by superimposing (i) the mapping diagram ((b) of FIG. 11) in which the film thickness of the hole injecting layer 4 is a value obtained by subtracting 5 nm from the center of the film thickness range corresponding to 0.5 cav. and (ii) the mapping diagram ((d) of FIG. 11) in which the film thickness of the hole injecting layer 4 is a value obtained by adding 5 nm to the center of the film thickness range corresponding to 0.5 cav.

Figure 12:
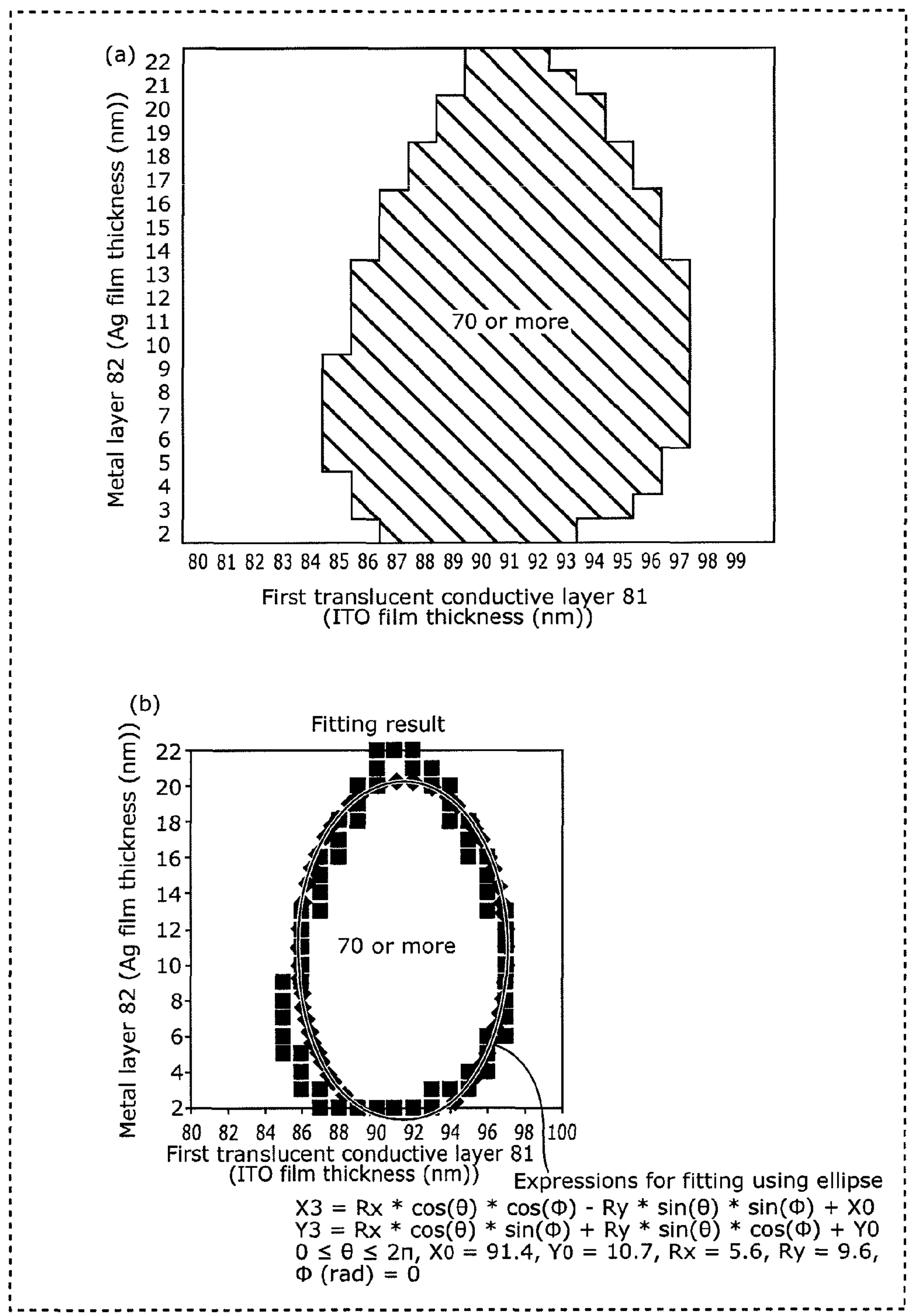
FIG. 12 is composed of (a) which is a mapping diagram illustrating a range of film thicknesses of the first translucent conductive layer 81 and the metal layer 82 which provide, in common, luminance/y values of 70 and more according to Example 1a, and (b) which is a diagram obtained by fitting the range using an ellipse.

In FIG. 12, (a) is a mapping diagram illustrating the result. In the film thickness range (the range of ±5 nm from the center), corresponding to 0.5 cav., of the first functional layers, the first translucent conductive layers 81 and the metal layers 82 have film thicknesses in ranges that define, in (a) of FIG. 12, the hatched range in which luminance/y values are approximately 70 or more in common.

In the diagram, the film thickness range in which luminance/y values are 70 or more of the first translucent conductive layers 81 is from 85 nm to 97 nm, and the film thickness range in which luminance/y values are 70 or more of the metal layers 82 is from 2 nm to 22 nm.

Accordingly, when the film thickness of the hole injecting layer 4 (the optical film thickness of the first functional layer) corresponds to 0.5 cav., it is possible to set the film thicknesses of the first translucent conductive layers 81 to be within the range from 85 nm to 97 nm, and the film thicknesses of the metal layers 82 to be within the range from 2 nm to 22 nm. At this time, it is possible to efficiently extract blue light having an excellent chromaticity, and increase the luminance/y value more significantly than in Comparative example 1a'.

In FIG. 12, (b) is a diagram obtained by fitting, using an ellipse, the film thickness range in which luminance/y values are 70 or more of the first translucent conductive layers 81 and the metal layers 82. This ellipse used for the fitting can be expressed according to Expressions 4.

$$X=Rx\cos\theta\cos\phi-Ry\sin\theta\sin\phi+X0$$

$$Y=Rx\cos\theta\sin\phi+Ry\sin\theta\cos\phi)+Y0 \quad \text{[Expressions 4]}$$

Here, X is the film thickness of each first translucent conductive layer 81, and Y is the film thickness of each metal layer 82.

In addition, θ is a variable parameter which changes within the range of $0\leq\theta\leq2\pi$, X0=91.4, Y0=10.7, Rx=5.6, Ry=9.6, and $\phi=0$ are satisfied.

In the case where the film thickness X of the first translucent conductive layer 81 and the film thickness Y of the metal layer 82 are within the range enclosed by the ellipse expressed according to Expressions 4 when the optical film thickness L of the first functional layer corresponds to 0.5 cav., the luminance/y value is 70 or more and thus is preferable for extracting blue light having an excellent chromaticity with a high efficiency.

[Consideration in the Case where Optical Film Thickness L of First Functional Layer is 1.5 Cav.]

Next, a case where the optical film thickness L of the first functional layer corresponds to 1.5 cav. is considered.

As illustrated in (a) and (b) of FIG. 7, Example 1b is the same in configuration as Example 1a, except that the film thickness of the hole injecting layer 4 corresponds to 1.5 cav. (see FIG. 9).

As illustrated in (a) and (b) of FIG. 7, the film thickness range corresponding to 0.5 cav. of the hole injecting layer 4 (Example 1a) and the film thickness range corresponding to 1.5 cav. of the hole injecting layer 4 (Example 1b) are different by 140 mm. This difference is converted to an optical film thickness of 224 nm according to the following expression: 140 nm×1.6=224 nm.

Accordingly, the range of optical film thicknesses L corresponding to 1.5 cav. is the range (272 nm to 286 nm) obtained by adding 224 nm to the range (48 nm to 62 nm) of the film thicknesses L corresponding to 0.5 cav.

Simulations of the following are also performed: blue light emitted from blue light emitting elements according to Example 1b and Comparative example 1b' which is the same as Example 1b except that the translucent cathode is made only of ITO.

FIG. 13 illustrates refractivities, film thicknesses (nm), and optical film thicknesses (nm) of layers of each of Example 1b and Comparative example 1b' used in the simulations.

Figure 14:
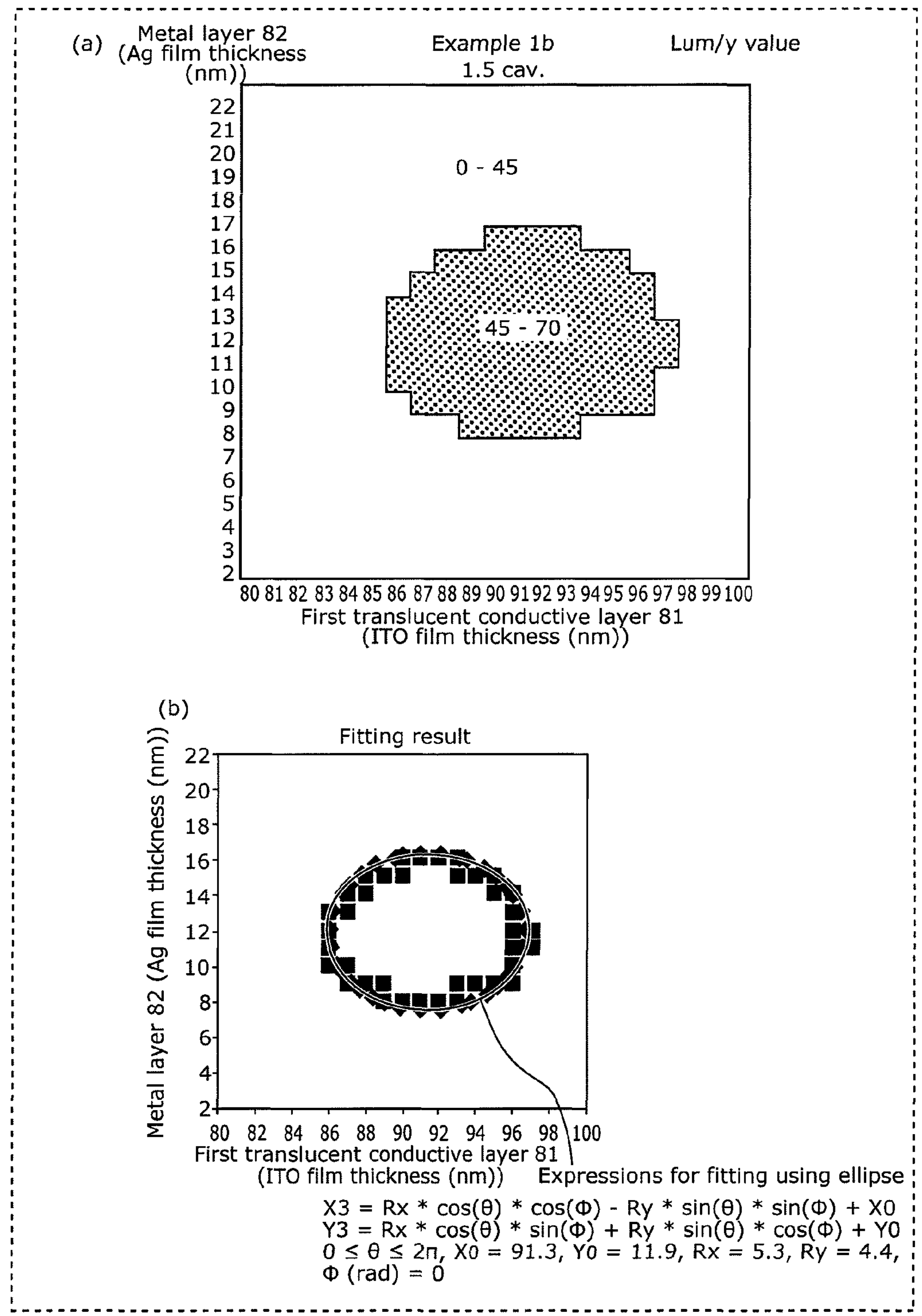
FIG. 14 is composed of (a) which is a mapping diagram of luminance/y values generated based on the results of the simulations regarding the blue light emitting elements according to Example 1b, and (b) which is a diagram obtained by fitting the range using an ellipse.

In FIG. 14, (a) is a mapping diagram illustrating a film thickness range of the first translucent conductive layers 81 and the metal layers 82 in the respective blue light emitting elements according to Example 1b. In the film thickness range, luminance/y values are no less than 45 or below 70, and the blue light emitting elements each have an optical film thickness L that is within the range corresponding to 1.5 cav.

The luminance/y values approximately corresponding to 1.5 cav. shown in (a) of FIG. 14 are low values as a whole compared to the luminance/y values approximately corresponding to 0.5 cav. shown in FIGS. 11 and 12. This is because, as illustrated in the graph (a) of FIG. 7, the blue light extraction efficiency in the case where an optical film thickness L corresponds to 1.5 cav. is lower than the blue light extraction efficiency in the case where an optical film thickness L corresponds to 0.5 cav.

The luminance/y value of Comparative example 1b' is 41. Thus, when the luminance/y value of Example 1b is 45 or above, this luminance/y value is sufficiently increased from the one in Comparative example 1b'.

In FIG. 14, (a) is a mapping diagram in the case where the center of the optical film thickness L range (272 nm to 286 nm) corresponding to 1.5 cav. is 279 nm. Approximately the same result is obtained in the range.

Accordingly, when the optical film thickness L is within the range corresponding to 1.5 cav., it is possible to regard the range in which the luminance/y values illustrated in (a) of FIG. 14 are from 45 to 70 as a range in which the effect of increasing the luminance/y values is obtained.

In the range in which the luminance/y values illustrated in (a) of FIG. 14 are from 45 to 70, the film thicknesses of the first translucent conductive layers 81 range from 86 nm to 97 nm, and the film thicknesses of the metal layers 82 range from 8 nm to 16 nm.

Accordingly, in Embodiment 1b, the film thicknesses of the first translucent conductive layers 81 and the film thicknesses of the metal layers 82 may be set in the range. At this time, it is possible to increase the luminance/y values more significantly than in the case of Comparative example 1b'.

Next, fitting using an ellipse is performed on the range in which luminance/y values are from 45 to 70 illustrated in (a) of FIG. 14. In FIG. 14, (b) is a diagram illustrating the result.

When the film thickness of each first translucent conductive layer 81 is X3, and the film thickness of each metal layer 82 is Y3, expressions for fitting the film thicknesses using the ellipse are expressed according to Expressions 5 below.

$$X3 = Rx\cos\theta\cos\phi - Ry\sin\theta\sin\phi + X0$$

$$Y3 = Rx\cos\theta\sin\phi + Ry\sin\theta\cos\phi + Y0 \qquad \text{[Expressions 5]}$$

Here, $0 \le \theta \le 2\pi$, X0=91.3, Y0=11.9, Rx=5.3, Ry=4.4, and $\phi=0$ (rad) are satisfied.

Accordingly, when the film thickness of the first translucent conductive layer 81 and the film thickness of the metal layer 8 are set to be within the range expressed using the ellipse, it is possible to obtain the effect of increasing the luminance/y value in a more reliable manner.

Here, when comparing (a) of FIG. 12 and (a) of FIG. 14, as for the film thicknesses of the first translucent conductive layers 81 and the metal layers 82, the range in which an effect of increasing luminance/y values is observed in (a) of FIG. 12 approximately corresponds to the range in which effects of increasing luminance/y values are observed in (a) of FIG. 14. Accordingly, the ranges in which the effects of increasing luminance/y values are observed are mostly common in the cases of 1.5 cav. and 0.5 cav.

Accordingly, it is also possible to say that the effects of increasing luminance/y values are expected by setting the film thicknesses within the range expressed using the ellipse according to Expressions 4, in any of the cases of 0.5 cav. and 1.5 cav.

(Regarding Materials of First Translucent Conductive Layer 81 and Metal Layer 82)

The results of the simulations each show a case where the first translucent conductive layer 81 is ITO, and the metal layer 82 is Ag. As for the refractivities of the first translucent conductive layer 81 and the second translucent conductive layer 83, similar results of simulations are obtained as long as the refractivities are within the range (in which the refractivities range from 2.0 to 2.4) close to the refractivity (2.1) of ITO.

In addition, as for the differences between the refractivities of the first translucent conductive layer 81 and the second translucent conductive layer 83 and the refractivity of the metal layer 82, similar results of simulations are obtained as long as the refractivities are within the range in which the refractivity (2.1) of ITO and the refractivity (0.1) of Ag is different by no more than a value (2.0).

Accordingly, the material for the metal layer 82 is not limited to ITO, and may be IZO (having a refractivity of 2.0), and the material for the metal layer is not limited to Ag, and may be Au, PT, Pd, Ni, Cu, or Al, or an alloy of any of these metals. When the refractivities of the first translucent conductive layer 81 and the second translucent conductive layer 83 are in the range from 2.0 to 2.4, and the differences between the refractivities of the first translucent conductive layer 81 and the second translucent conductive layer 83 and the refractivity of the metal layer 82 are in the range from 0 to 2.0, it is possible to obtain the effect of increasing the luminance/y value by setting the film thicknesses of the first translucent conductive layer 81 and the metal layer 82 to be within the above-described range.

[Summary of the Effects Produced by Blue Light Emitting Elements According to Embodiment 1]

Based on the results of simulations above, it is known that the effects of increasing the luminance/y values is obtained by (i) setting the resonator structure to 0.5 cav. or 1.5 cav., and (ii) setting, to the above-described range, the film thicknesses of the first translucent conductive layer 81 and the metal layer 82 which form the translucent cathode 8.

It has conventionally been considered that a cathode formed to include a metal layer reduces light extraction efficiency. In view of this, in this embodiment, it is known that the light extraction efficiency can be increased more than in Comparative examples 1a' and 1b in which the cathode is formed not to include any metal layer, by (i) setting, to be within a predetermined range, the differences in refractivity between the metal layer and the translucent conductive layers adjacent to the metal layer which form the translucent cathode, (ii) setting, to be within a predetermined range, the refractivity and film thickness of the first translucent conductive layer (first conductive layer) arranged at the (second) functional layer side in the stack structure of the translucent cathode, and (iii) setting, to be within a predetermined range, the optical film thickness of the first functional layer arranged between the first electrode and the organic light emitting layers.

Accordingly, this increase in the luminance/y values makes it possible to increase the light extraction efficiency after the light passes through the CF. This allows the blue light emitting elements to be driven at a reduced power. This reduced-power driving of the blue light emitting elements leads to extension of the life of these elements.

In addition, when the film thickness of the metal layer is set to be no less than 10 nm, it is possible to reduce the sheet resistance value of the translucent cathode 8 to 10Ω/□ or less. Thus, it is possible to sufficiently reduce voltage decrease at the panel center without requiring a bus bar. Therefore, it is possible to increase an aperture ratio by reducing the size of the bas bar, or removing a bas bar (forming a structure without any bus bar).

In this way, the blue light emitting elements according to this embodiment are effective to achieve both reduction in voltage decrease and increase in light extraction efficiency.

It is to be noted that in actual blue light emitting elements, allowance in the variation in the film thicknesses and optical film thicknesses of the respective layers is generally approximately ±10% from the average value. Accordingly, it is only necessary that the average values (ave) of the film thicknesses of layers in actual blue light emitting elements be set to correspond to the range of the film thicknesses of the respective layers obtained based on the simulations.

Embodiment 2

Although the organic display panel having the top emission structure has been described in Embodiment 1, an organic display panel having a bottom emission structure is taken as an example and described in Embodiment 2.

Embodiment 2 is the same as Embodiment 1 in the point that light emitting elements each of which emits R, G, or B light are arranged regularly in a matrix.

FIG. 15 is a diagram illustrating a blue light emitting element in the organic display panel according to Embodiment 2.

In each of the light emitting elements in the organic display panel, a translucent cathode 32, an electron transporting layer 34, an organic light emitting layer 35, a hole transporting layer 36, a hole injecting layer 37, and a photoanode 38 are stacked on and above a surface of the substrate 31 in this order, and a bank 33 is formed between adjacent EL light emitting elements.

In each of the light emitting elements, light is emitted from the side of the substrate 31 to outside (toward the bottom of the paper sheet of FIG. 15).

In Embodiment 1, the first functional layer is formed of three layers which are the translucent conductive layer 3, the hole injecting layer 4, and the hole transporting layer 5. In Embodiment 2, the first functional layer is formed of two layers which are the hole injecting layer 37 and the hole transporting layer 36, and no translucent conductive layer is present between the photoanode 38 and the hole injecting layer 37.

Embodiment 2 is different in layer structure in this point from Embodiment 1, but the other layers in Embodiment 2 are similar to those in Embodiment 1.

Stated differently, the substrate 31 is similar in structure to the substrate 1 described in Embodiment 1, and the electron transporting layer 34, the organic light emitting layer 35, the hole transporting layer 36, the hole injecting layer 37, and the photoanode 38 are formed using similar materials to those used for the electron transporting layer 7, the organic light emitting layer 6, the hole transporting layer 5, the hole injecting layer 4, and the photoanode 2 described in Embodiment 1.

In each of the light emitting elements each of which emits R, G, or B light also in the organic display panel according to this embodiment, the different-color organic light emitting layers 35 are present between the translucent cathode 32 and the photoanode 38, and the optical resonator structure for allowing light from the organic light emitting layer 35 to resonate and to be emitted from the side of the translucent cathode 32. Stated differently, in the optical resonator structure, the following optical paths are formed: a first optical path C5 in which part of light emitted from the organic light emitting layer 35 travels toward the translucent cathode 32, and emitted from the substrate 31 to the outside of the organic light emitting elements; and a second optical path C6 in which the remaining part of the light emitted from the organic light emitting layer 35 travels toward the photoanode 38, is reflected by the photoanode 38, passes through the organic light emitting layer 35 and the translucent cathode 32, and then is emitted to the outside of the organic light emitting elements.

[Optical Film Thickness L Between Organic Light Emitting Layer 35 and Photoanode 38]

FIG. 16 illustrates the refractivities, film thicknesses (n and optical film thicknesses (nm) of respective layers of bottom-emission blue light emitting elements based on Embodiment 2.

In FIG. 17, (a) is a graph showing the results of simulations of the efficiencies of extracting blue light from blue light emitting elements according to Embodiment 2 in the case where the hole injecting layer 37 of each of the blue light emitting elements has a film thickness ranging from 0 to 200 nm different from those of the hole injecting layers 37 of the other blue light emitting elements. The horizontal axis denotes the film thickness of the hole injecting layer 4, and the perpendicular axis denotes the light extraction efficiency. These simulations are performed using the blue light emitting elements between which the layers other than the hole injecting layer 37 have the same film thicknesses as illustrated in FIG. 16.

The optical film thickness L of the first functional layer changes in proportion to a change in the film thickness of the hole injecting layer 37. Thus, the graph (a) in FIG. 17 shows the relationships between the optical film thicknesses L of the first functional layers and the light extraction efficiencies.

In FIG. 17, (b) is a graph showing the results of simulations of variation in the chromaticity (x values and y values in the CIE chromaticity system) of blue light which is extracted from the blue light emitting elements each including the hole injecting layer 37 having the different film thickness. The horizontal axis denotes the film thicknesses of the hole injecting layers 4, and the perpendicular axis denotes the chromaticity of blue light extracted from the blue light emitting elements.

Similarly to Embodiment 1, also in Embodiment 2, the film thicknesses of the hole injecting layers 37 include the film thickness corresponding to 0.5 cav. In the case of the film thickness corresponding to 0.5 cav., the efficiency of extracting blue light from the blue light emitting element is smaller than in the cases of the film thickness corresponding to 1st cav. as illustrated in (a) of FIG. 17. However, since the y value illustrated in (b) of FIG. 17 is small, and thus the luminance/y value is the local maximum value.

In view of this, Embodiment 2 also employs a resonator structure in which the optical film thickness L of the first functional layer between the organic light emitting layer 35 and the photoanode 38 is set to a value corresponding to 0.5 cav.

It is to be noted that the optical film thicknesses L corresponding to 0.5 cav. range from 48 nm to 62 nm in the case of the first functional layers in Embodiment 1, but the optical film thicknesses L corresponding to 0.5 cav. are in a smaller film thickness range (from 17 nm to 33 nm) in Embodiment 2.

It is considered that the optical film thicknesses L of the first functional layer corresponding to 0.5 cav. are different between Embodiment 1 and Embodiment 2 because of the difference between the layer structures of the both.

FIG. 16 illustrates, as an example, a case where the hole injecting layer 4 has a thickness of 5 nm corresponding to the center value of the range corresponding to 0.5 cav. and the hole transporting layer 36 has a thickness of 10 nm, stated differently, the film thickness of the first functional layer (formed of the hole transporting layer 36 and the hole injecting layer 37) is 15 nm. In the simulations, the hole injecting layers 37 are set to have different film thicknesses within the range from 0 to 10 nm corresponding to 0.5 cav. whereas the hole transporting layers 36 are set to have the same (10 nm) film thicknesses. Since the hole injecting layers 37 have the different film thicknesses within this range, the first functional layers have different optical film thicknesses L within the range from 17 to 3:3 nm.

[Translucent Cathode 32]

Similarly to Embodiment 1, the translucent cathode 32 is configured by stacking a first translucent conductive layer 321 made of a translucent conductive material, a metal layer 322, a second translucent conductive layer 323 made of a translucent conductive material in this order from the side of the organic light emitting layer 35 and the side of the substrate 31.

The materials (transparent conductive materials) of the first translucent conductive layer 321 and the second translucent conductive layer 323 are ITO, IZO, or the like, similarly to the materials of the first translucent conductive layer 81 and the second translucent conductive layer 83 in Embodiment 1. The material for the metal layer 322 is Ag, Au, Pt, Pd, Ni, Cu, or Al, or an alloy of any of these metals, as in the case of the metal layer 82 in Embodiment 1.

In addition, it is possible to set the film thickness of the metal layer 322 in the translucent cathode 32 to 10 nm or more, and to thereby reduce the sheet resistance value to be 10Ω/□ or below.

In addition, the film thicknesses of the respective layers which are the first translucent conductive layer 321, the metal layer 322, and the second translucent conductive layer 323 which form the translucent cathode 32 are also set so that the luminance/y values in the blue light emitting elements are increased.

[Simulations of Light Emitted by Blue Light Emitting Elements]

The blue light emitting elements used in the simulations according to Example 2 includes the first functional layer having an optical film thickness corresponding to 0.5 cav. The translucent cathode 32 has a three-layer structure of ITO-Ag-ITO.

Simulations of blue light emitted from blue light emitting elements is performed using blue light emitting elements according to Example 2 each including a translucent cathode 32 having a three-layer structure in which the first translucent conductive layer 321, the metal layer 322, and the second translucent conductive layer 323 have film thicknesses which are different, as a whole, from those in the translucent cathode 32 of any of the other blue light emitting elements. As a result, luminance/y values are obtained from the respective blue light emitting elements.

As a result, similarly to the results of the simulations in Example 1b, the luminance/y values do not depend on the film thicknesses of the second translucent conductive layers 323 so much, and depend on the film thicknesses of the first translucent conductive layers 321 and the film thicknesses of the metal layers 322.

Figure 18:
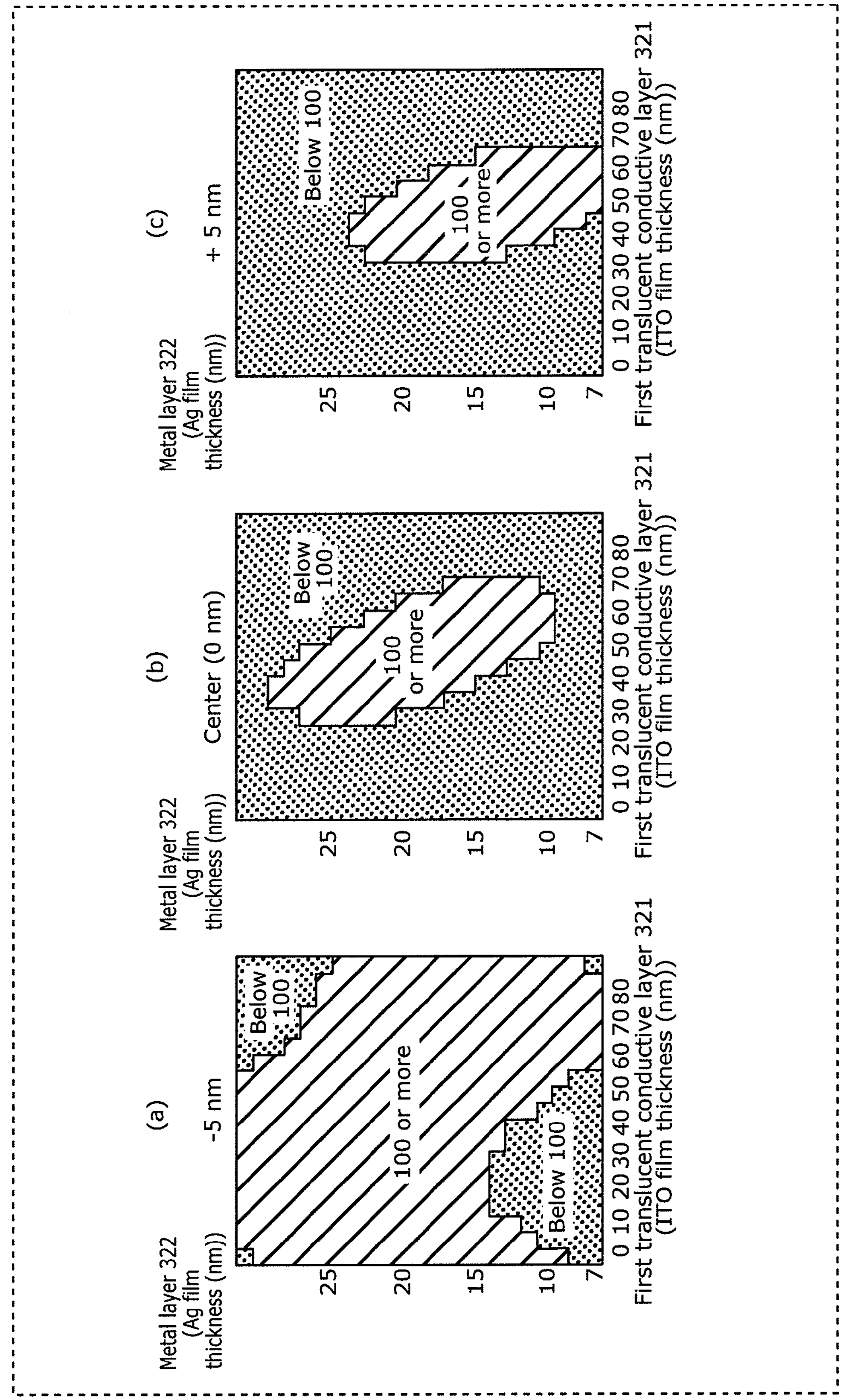
FIG. 18 is composed of (a) to (c) each of which is a mapping diagram of luminance/y values generated based on the results of the simulations regarding the blue light emitting elements according to Example 2.

In FIG. 18, each of (a) to (c) is a mapping diagram in which the film thicknesses of the first translucent conductive layers 321 and the metal layers 322 are different, as a whole, from those in any of the others, resulting luminance/y values are plotted on orthogonal coordinates, and the whole area is divided into a segment in which luminance/y values are less than 100, and a segment in which luminance/y values are 100 or more.

It is to be noted that the film thicknesses of the hole injecting layers 37 are larger in the order of (a) to (c). Accordingly, the optical film thicknesses L of the first functional layers are also larger in this order.

In FIG. 18, (b) illustrates a case where the film thickness of the hole injecting layer 37 is at the center (5 nm) corresponding to 0.5 cav. illustrated in (a) and (b) of FIG. 17 (the case where the optical film thickness L of the first functional layer is 25 nm).

In FIG. 18, (a) is a mapping diagram in the case where the film thickness of the hole injecting layer 37 is a value obtained by subtracting 5 nm from the center of the film thickness range corresponding to 0.5 cav., (b) is a mapping diagram in the case where the film thickness of the hole injecting layer 37 is a value corresponding to the center (i.e., a value of 0 nm) of the film thickness ran e corresponding to 0.5 cav., and (c) is a mapping diagram in the case where the film thickness of the hole injecting layer 37 is a value obtained by adding 5 nm from the center of the film thickness range corresponding to 0.5 cav.

The range in which the film thickness of the hole injecting layer 37 illustrated in (a) of FIG. 17 corresponding to 0.5 cav. corresponds to the ranges illustrated in (a), (b), and (d) of FIG. 18, specifically, the ranges in which the hole injecting layers 37 have film thicknesses of ±5 nm from the center of the film thickness range corresponding to 0.5 cav.

As illustrated in FIG. 16, the EL blue light emitting element in Comparative example 2' provides a luminance/y value of 42, and thus it can be said that the light extraction effect is at least doubled in the range in which luminance/y values are 100 or more.

In each of the mapping diagrams (a) to (c) of FIG. 18, there is a tendency that the range in which luminance/y values are 100 or more depends on both the film thicknesses of the first translucent conductive layers 321 and the film thicknesses of the metal layers 322, and it is known that when the optical film thicknesses L of the first functional layer transit to a film thickness corresponding to 0.5 cav., the film thickness range in which luminance/y values are 100 or more of the first translucent conductive layer 321 also transits.

Next, the film thickness range of the first translucent conductive layers 321 and the metal layers 322 in which luminance/y values are 100 or more are obtained by superimposing a mapping diagram ((a) of FIG. 18) illustrating a case where the film thickness of the hole injecting layer 37 is a value obtained by subtracting 5 nm from the center of the film thickness corresponding to 0.5 cav. and a mapping diagram ((c) of FIG. 18) illustrating a case where the film thickness of the hole injecting layer 37 is a value obtained by adding 5 nm to the center of the film thickness corresponding to 0.5 cav.

Figure 19:
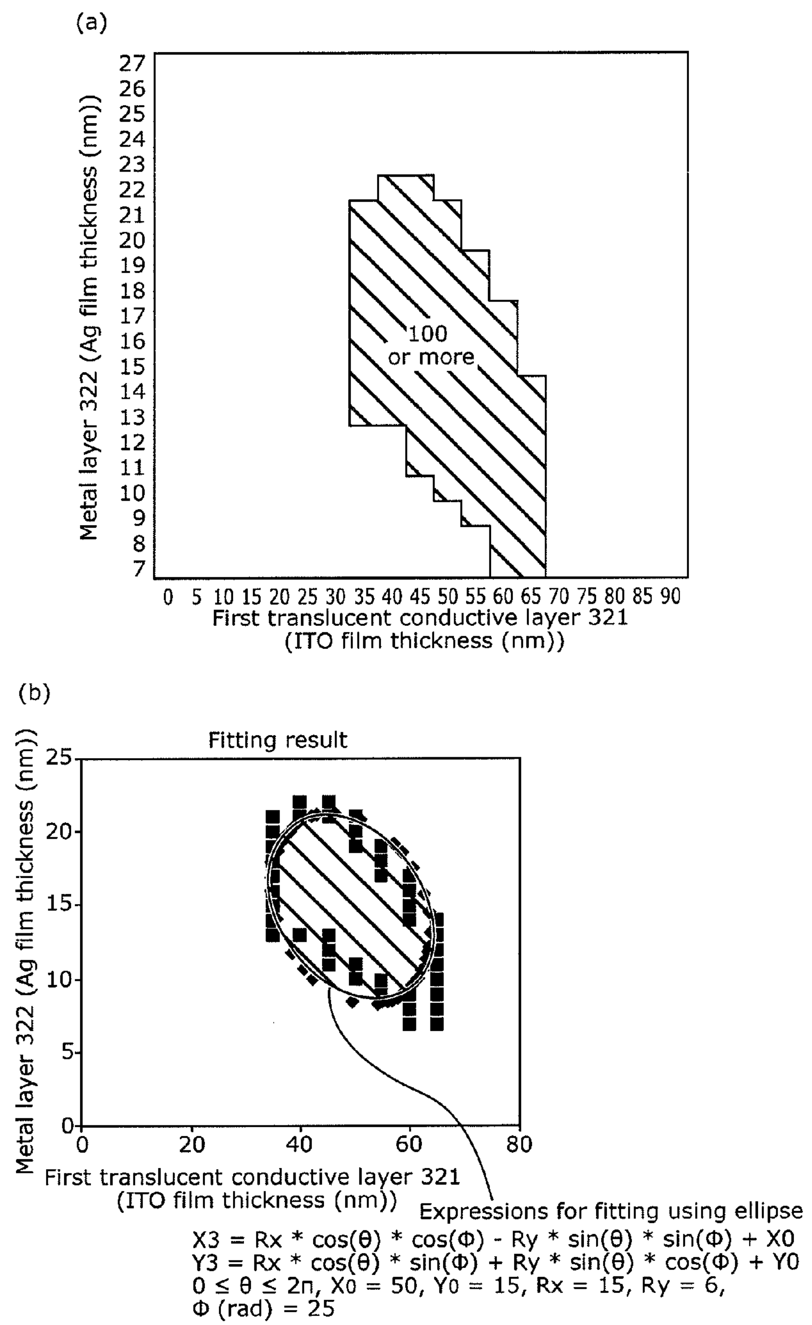
FIG. 19 is composed of (a) which is a mapping diagram, in Example 2, illustrating a film thickness range of first translucent conductive layers 321 and metal layers 322 which provide, in common, luminance/y values of 100 or more, and (b) which is a diagram obtained by fitting the range using an ellipse.

In FIG. 19, (a) is a mapping diagram illustrating the result. The film thickness range (the range of ±5 nm from the center) of the first functional layer corresponding to 0.5 cav. corresponds to the film thickness range of the first translucent conductive layers 321 and the metal layers 322, in which luminance/y values are approximately 90 or more in common.

In the diagram, the film thickness range in which luminance/y values are 90 or more of the first translucent conductive layers 321 is from 35 nm to 65 nm, and the film thickness range in which luminance/y values are 90 or more of the metal layers 322 is from 7 nm to 22 nm.

Accordingly, when the film thickness of the hole injecting layer 37 (optical film thickness of the first functional layer) corresponds to 0.5 cav., in order to efficiently extract blue light having an excellent chromaticity, it is preferable that the film thicknesses of the first translucent conductive layers 321 be set within the range from 35 nm to 65 nm, and the film thicknesses of the metal layers 322 be set within the range from 2 nm to 22 nm.

FIG. 19, (b) is a diagram obtained by fitting, using an ellipse, the film thickness ranges of the first translucent conductive layers 321 and the metal layers 322, in which luminance/y values are 90 or more illustrated in (a) of FIG. 19. This ellipse used for the fitting can be expressed according to Expressions 6.

$$X3=Rx\cos\theta\cos\phi-Ry\sin\theta\sin\phi+X0$$

$$Y3=Rx\cos\theta\sin\phi+Ry\sin\theta\cos\phi+Y0 \qquad \text{[Expressions 6]}$$

Here, $0\le\theta\le2\pi$, X0=50, Y0=15, Rx=15, Ry=6, and $\phi=25$ (rad) are satisfied.

The simulations show that, by setting the film thicknesses of the first translucent conductive layers 321 and the film thicknesses of the metal layers 322 in the blue light emitting elements according to Example 2 within the range of the ellipse expressed in the above Expressions 6, the resulting luminance/y values are at least doubled from those in the comparative example, stated differently, the efficiency of extracting blue light having an excellent chromaticity is significantly increased.

This increase in the efficiency of extracting the blue light from the blue light emitting elements allows the elements to be driven at a reduced power and leads to extension of the life of the elements.

In addition, when the film thickness of the metal layer 322 is set to approximately 10 nm or more, it is possible to reduce the sheet resistance value of the translucent cathode 32 to or below 10Ω/□, and to thus reduce voltage decrease without providing any bus bar.

In this way, blue light emitting elements according to this embodiment are also capable of achieving both reduction in voltage decrease at the center part of the panel, and increase in light extraction efficiency.

It is to be noted that the film thickness ranges of the first translucent conductive layers and the metal layer in which luminance/y values are high are different between Embodiment 1 and Embodiment 2. This is because the optical film thicknesses L of the first functional layers are different from each other.

[Regarding Materials of First Translucent Conductive Layer 321 and Metal Layer 322]

The results of the simulations each show a case where the first translucent conductive layer 321 is ITO, and the metal layer 322 is Ag. As for the refractivities of the first translucent conductive layer 321 and the second translucent conductive layer 323, similar results of simulations are obtained as long as the refractivities are within the range (in which the refractivities are from 2.0 to 2.4) close to the refractivity (2.1) of ITO.

In addition, as for the differences between the refractivities of the first translucent conductive layer 321 and the second translucent conductive layer 323 and the refractivity of the metal layer 322, similar results of simulations are obtained as long as the refractivities are within the range in which the refractivity (2.1) of ITO and the refractivity (0.1) of Ag are different by no more than a value (2.0).

Accordingly, the material for the metal layer 322 is not limited to ITO, and may be IZO (refractivity 2.0), and the material for the metal layer 322 is not limited to Ag, and may be Au, Pt, Pd, Ni, Cu, or Al, or an alloy of any of these metals. When the refractivities of the first translucent conductive layer 321 and the second translucent conductive layer 323 range from 2.0 to 2.4, and the differences between the refractivities of the first translucent conductive layer 321 and the second translucent conductive layer 323 and the refractivity of the metal layer 322 range from 0 to 2.0, an effect of increasing luminance/y values can be obtained by setting the film thicknesses of the first translucent conductive layer 321 and the metal layer 322 within the above-described range.

[Variations]

(1) Although the first functional layer includes the hole injecting layer and the hole transporting layer in each of Embodiments 1 and 2, the first functional layer is not limited to the configuration, and does not have to include any of the hole injecting layer and the hole transporting layer, or may include a functional layer other than these layers.

Although the second functional layer includes an electron transporting layer in each of Embodiments 1 and 2, the second functional layer is not limited to the configuration, and may further include an electron injecting layer.

(2) In each of Embodiments 1 and 2, the anode is provided at a side close to the substrate above which TFTs are mounted and a cathode is provided at a side farther to the substrate, but the opposite case where the cathode is provided at a side close to the substrate above which TFTs are mounted and an anode is provided at a side farther to the substrate can be implemented in the same manner.

(3) In the organic display panel according to Embodiment 1, the color filter does not have to be included. In addition, a color filter may be provided in the organic display panel according to Embodiment 2.

Although the organic light emitting elements, organic light emitting display panels, and organic light emitting display apparatuses according to aspects of the present disclosure have been described above, the present invention is not at all limited to the above-described embodiments except for inherent characteristic constituent elements. For example, the present invention covers embodiments obtainable by adding, to any of the embodiments, various kinds of modifications that would be arrived at by any person skilled in the art, and embodiments obtainable by arbitrarily combining constituent elements and functions in any of the embodiments without deviating from the scope of the present invention.

INDUSTRIAL APPLICABILITY

The organic light emitting elements are widely applicable to organic light emitting apparatuses represented by organic EL display panels and organic EL light emitting apparatuses.

REFERENCE SIGNS LIST

1, 11, 31 Substrate
2, 38 Photoanode
3 Translucent conductive layer
4, 37 Hole injecting layer
5, 36 Hole transporting layer
6, 6*b*, 6*g*, 6*r*, 35 Organic light emitting layer
7, 34 Electron transporting layer
8, 32 Translucent cathode
9 Thin-film sealing layer
10 Resin sealing layer
12, 33 Bank
13*b*, 13*g*, 13*r* Color filter
15 Organic display apparatus
16 Organic display panel
17 Driver control unit
18-21 Driver circuit
22 Control circuit
81, 321 First translucent conductive layer
82, 322 Metal layer
83, 323 Second translucent conductive layer

The invention claimed is:

1. An organic light emitting element comprising:
a first electrode which reflects incident light;
a second electrode which is disposed opposing the first electrode, and allows the incident light to pass through;
an organic light emitting layer which is disposed between the first electrode and the second electrode, and emits at least blue light;
a first functional layer which is disposed between the first electrode and the organic light emitting layer, and formed of one or more layers; and
a second functional layer which is disposed between the organic light emitting layer and the second electrode, and formed of one or more layers,
wherein the following paths are formed in the organic light emitting element:
a first optical path in which part of the blue light emitted from the organic light emitting layer enters the first electrode through the first functional layer, is reflected by the first electrode, and is emitted outside through the first functional layer, the organic light emitting layer, the second functional layer, and the second electrode; and
a second optical path in which remaining part of the blue light emitted from the organic light emitting layer travels to the second electrode through the second functional layer without travelling toward the first electrode, and is emitted outside through the second electrode,
the first functional layer has an optical film thickness ranging from 48 nm to 62 nm,
the second electrode is a stack of a first conductive layer made of a translucent conductive material, a metal layer, and a second conductive material made of a translucent conductive material stacked in this order from a side close to the organic light emitting layer,
the first conductive layer has a refractivity ranging from 2.0 to 2.4, and has a film thickness ranging from 85 nm to 97 nm, and
the metal layer has a refractivity which is different by 0 to 2.0 from the refractivity of the first conductive layer, and has a film thickness ranging from 2 nm to 22 nm.

2. The organic light emitting element according to claim 1,
wherein in the second electrode,
when the film thickness of the first conductive layer is X3, and the film thickness of the metal layer is Y3,
X3 and Y3 each take a value within a range expressed by a corresponding one of the following relational expressions:

$$X3=Rx\cos\theta\cos\phi-Ry\sin\theta\sin\phi+X0,\text{ and}$$

$$Y3=Rx\cos\theta\sin\phi+Ry\sin\theta\cos\phi+Y0,$$

where θ is a variable parameter which changes within a range of $0\leq\theta\leq 2\pi$, and
X0=91.4, Y0=10.7, Rx=5.6, Ry=9.6, and ϕ=0 (rad) are satisfied.

3. The organic light emitting element according to claim 1,
wherein the metal layer has a film thickness of 10 nm or more.

4. The organic light emitting element according to claim 1, further comprising
a blue color filter which allows passage of light to be emitted outside through the second electrode.

5. An organic light emitting display panel comprising the organic light emitting element according to claim 1.

6. An organic light emitting display apparatus comprising the organic light emitting display panel according to claim 5.

7. An organic light emitting element comprising:
a first electrode which reflects incident light;
a second electrode which is disposed opposing the first electrode, and allows the incident light to pass through;
an organic light emitting layer which is disposed between the first electrode and the second electrode, and emits at least blue light;
a first functional layer which is disposed between the first electrode and the organic light emitting layer, and formed of one or more layers; and
a second functional layer which is disposed between the organic light emitting layer and the second electrode, and formed of one or more layers,
wherein the following paths are formed in the organic light emitting element:
a first optical path in which part of the blue light emitted from the organic light emitting layer enters the first electrode through the first functional layer, is reflected by the first electrode, and is emitted outside through the first functional layer, the organic light emitting layer, the second functional layer, and the second electrode; and
a second optical path in which remaining part of the blue light emitted from the organic light emitting layer travels to the second electrode through the second functional layer without travelling toward the first electrode, and is emitted outside through the second electrode,
the first functional layer has an optical film thickness ranging from 272 nm to 286 nm,
the second electrode is a stack of a first conductive layer made of a translucent conductive material, a metal layer, and a second conductive material made of a translucent conductive material stacked in this order from a side close to the organic light emitting layer, the first conductive layer has a refractivity ranging from 2.0 to 2.4, and has a film thickness ranging from 86 nm to 97 nm, and the metal layer has a refractivity which is different by 0 to 2.0 from the refractivity of the first conductive layer, and has a film thickness ranging from 8 nm to 16 nm.

8. The organic light emitting element according to claim 7, wherein in the second electrode, when the film thickness of the first conductive layer is X3, and the film thickness of the metal layer is Y3, X3 and Y3 each take a value within a range expressed by a corresponding one of the following relational expressions:

$$X3=Rx\cos\theta\cos\phi-Ry\sin\theta\sin\phi+X0,\text{ and}$$

$$Y3=Rx\cos\theta\sin\phi+Ry\sin\theta\cos\phi+Y0,$$

where $\theta$ is a variable parameter which changes within a range of $0\leq\theta\leq2\pi$, and X0=91.3, Y0=11.9, Rx=5.3, Ry=4.4, and $\phi=0$ (rad) are satisfied.

9. An organic light emitting element comprising:

a first electrode which reflects incident light;

a second electrode which is disposed opposing the first electrode, and allows the incident light to pass through;

an organic light emitting layer which is disposed between the first electrode and the second electrode, and emits at least blue light;

a first functional layer which is disposed between the first electrode and the organic light emitting layer, and formed of one or more layers; and a second functional layer which is disposed between the organic light emitting layer and the second electrode, and formed of one or more layers, wherein the following paths are formed in the organic light emitting element:

a first optical path in which part of the blue light emitted from the organic light emitting layer enters the first electrode through the first functional layer, is reflected by the first electrode, and is emitted outside through the first functional layer, the organic light emitting layer, the second functional layer, and the second electrode; and a second optical path in which remaining part of the blue light emitted from the organic light emitting layer travels to the second electrode through the second functional layer without travelling toward the first electrode, and is emitted outside through the second electrode, the first functional layer has an optical film thickness ranging from 17 nm to 33 nm, the second electrode is a stack of a first conductive layer made of a translucent conductive material, a metal layer, and a second conductive material made of a translucent conductive material stacked in this order from a side close to the organic light emitting layer, the first conductive layer has a refractivity ranging from 2.0 to 2.4, and has a film thickness ranging from 35 nm to 65 nm, and the metal layer has a refractivity which is different by 0 to 2.0 from the refractivity of the first conductive layer, and has a film thickness ranging from 7 nm to 22 nm.

10. The organic light emitting element according to claim 9, wherein in the second electrode, when the film thickness of the first conductive layer is X3, and the film thickness of the metal layer is Y3, X3 and Y3 each take a value within a range expressed by a corresponding one of the following relational expressions:

$$X3=Rx\cos\theta\cos\phi-Ry\sin\theta\sin\phi+X0,\text{ and}$$

$$Y3=Rx\cos\theta\sin\phi+Ry\sin\theta\cos\phi+Y0,$$

where $\theta$ is a variable parameter which changes within a range of $0\leq\theta\leq2\pi$, and X0=50, Y0=15, Rx=15, Ry=6, and $\phi=25$ (rad) are satisfied.

* * * * *